(12) United States Patent
Lu

(10) Patent No.: US 10,818,586 B1
(45) Date of Patent: Oct. 27, 2020

(54) SUBSTRATE STRUCTURE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 16/678,784

(22) Filed: Nov. 8, 2019

(51) Int. Cl.
| H05K 1/14 | (2006.01) |
| H05K 3/40 | (2006.01) |
| H01L 23/498 | (2006.01) |
| H01L 21/48 | (2006.01) |

(52) U.S. Cl.
CPC ...... *H01L 23/49822* (2013.01); *H01L 21/481* (2013.01); *H01L 21/486* (2013.01); *H01L 21/4853* (2013.01); *H01L 21/4857* (2013.01); *H01L 23/49811* (2013.01); *H05K 1/141* (2013.01); *H05K 3/40* (2013.01)

(58) Field of Classification Search
CPC ........ H05K 1/141; H05K 1/144; H05K 1/145; H05K 3/40; H05K 3/4007; H05K 3/4015; H05K 3/4611; H05K 3/4614
See application file for complete search history.

(56) References Cited

U.S. PATENT DOCUMENTS

2004/0074671 A1* 4/2004 Hirano .................... G06F 3/045
174/267
2004/0118598 A1* 6/2004 Fuller, Jr. .............. H05K 3/462
174/255

\* cited by examiner

*Primary Examiner* — Jeremy C Norris
(74) *Attorney, Agent, or Firm* — Foley & Lardner LLP

(57) ABSTRACT

A substrate structure is provided. The substrate structure includes a substrate, a first redistribution structure, a first adhesive layer and a first connecting component. The substrate includes a first conductor on a first surface thereof. The first redistribution structure is disposed over the substrate. The first adhesive layer is disposed between the substrate and the first redistribution structure. The first connecting component is electrically connected with the first conductor, penetrates through the first adhesive layer into the first redistribution structure, and electrically connects the substrate to the first redistribution structure.

15 Claims, 28 Drawing Sheets

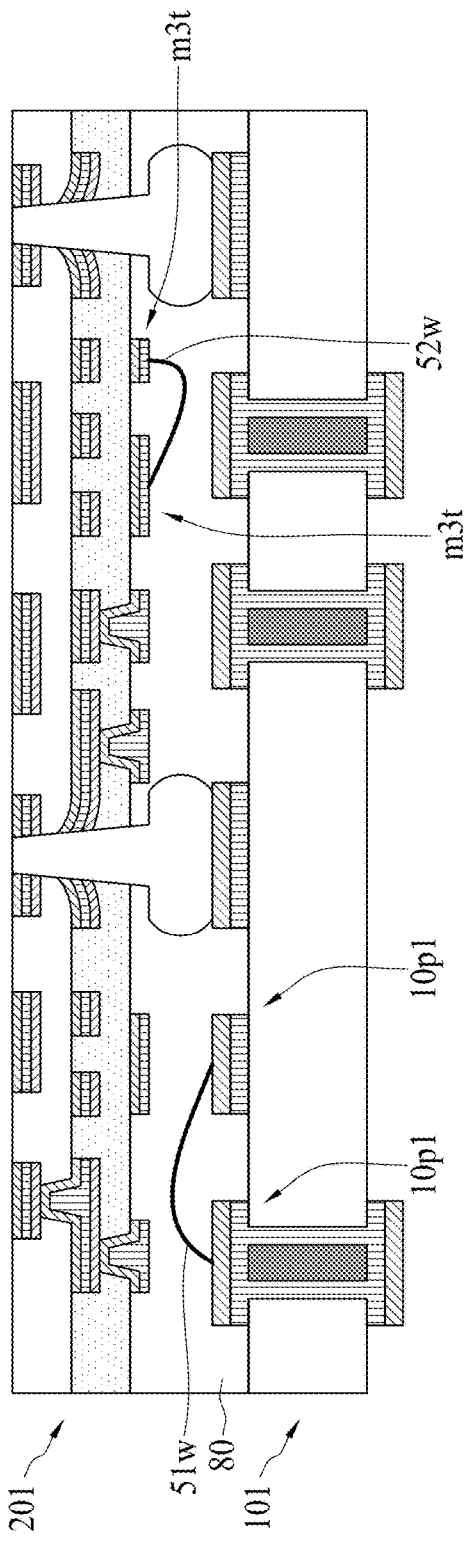
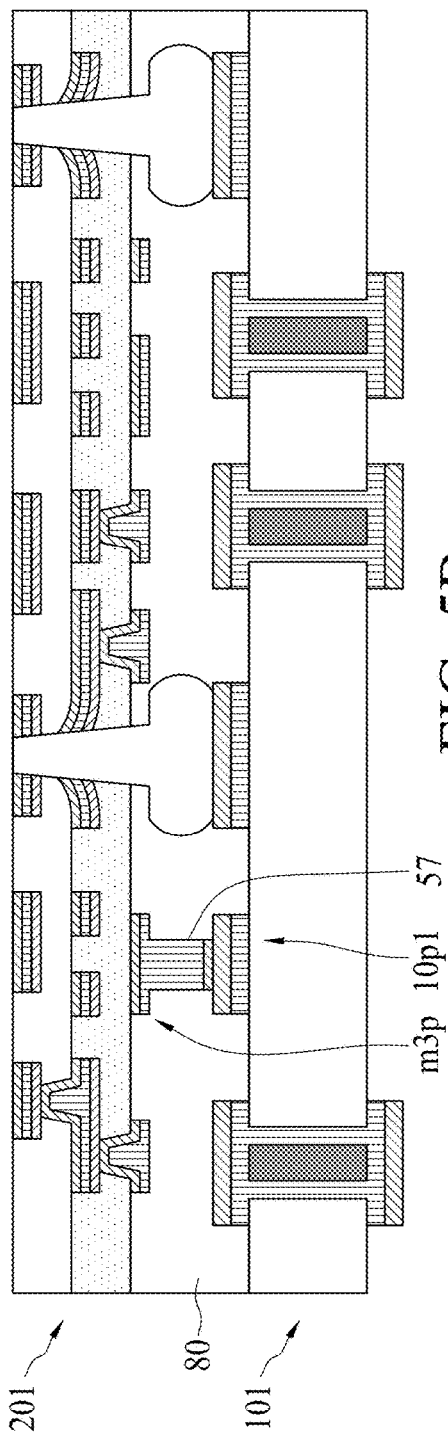
FIG. 5A
FIG. 5B

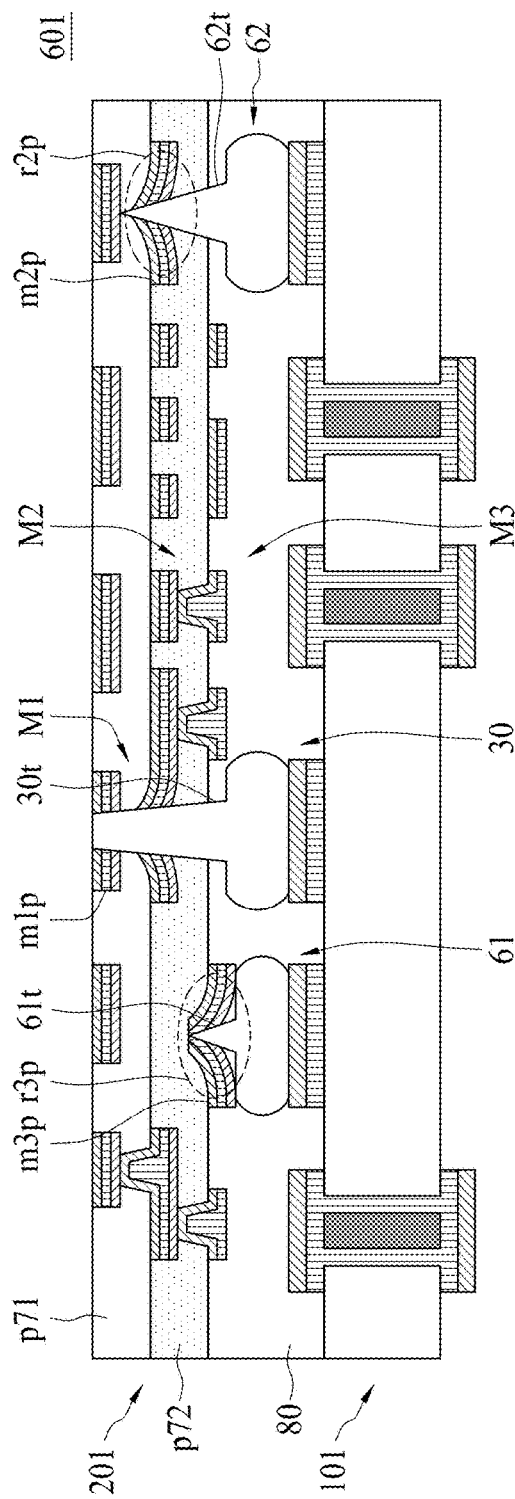
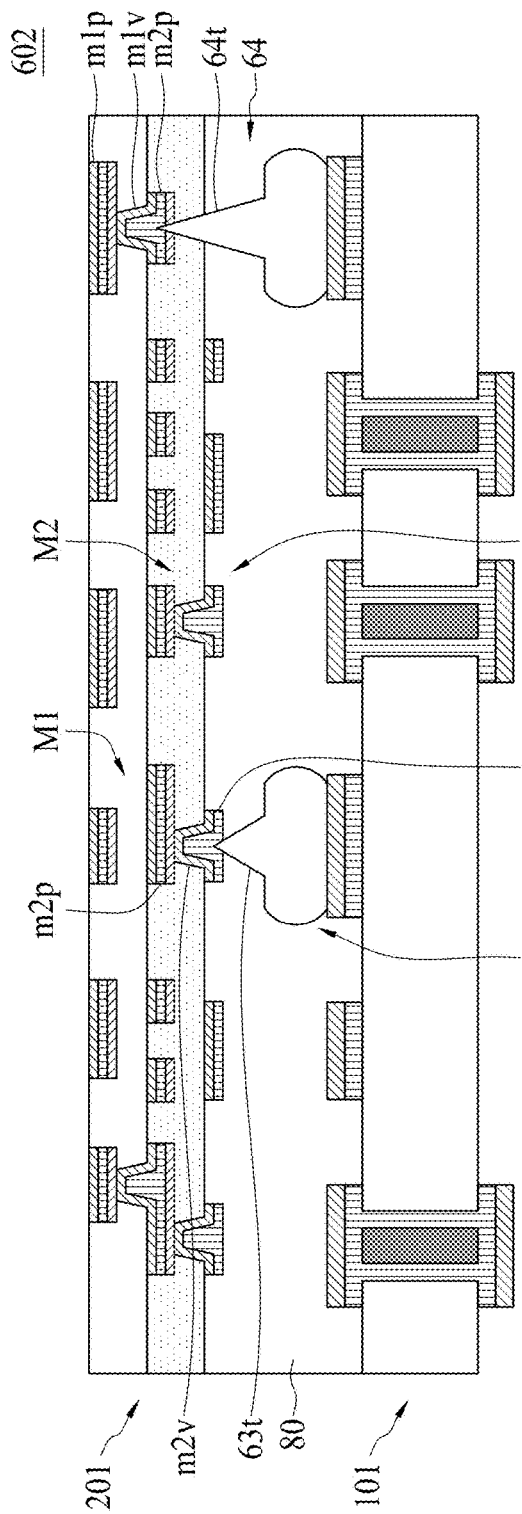
FIG. 6A
FIG. 6B

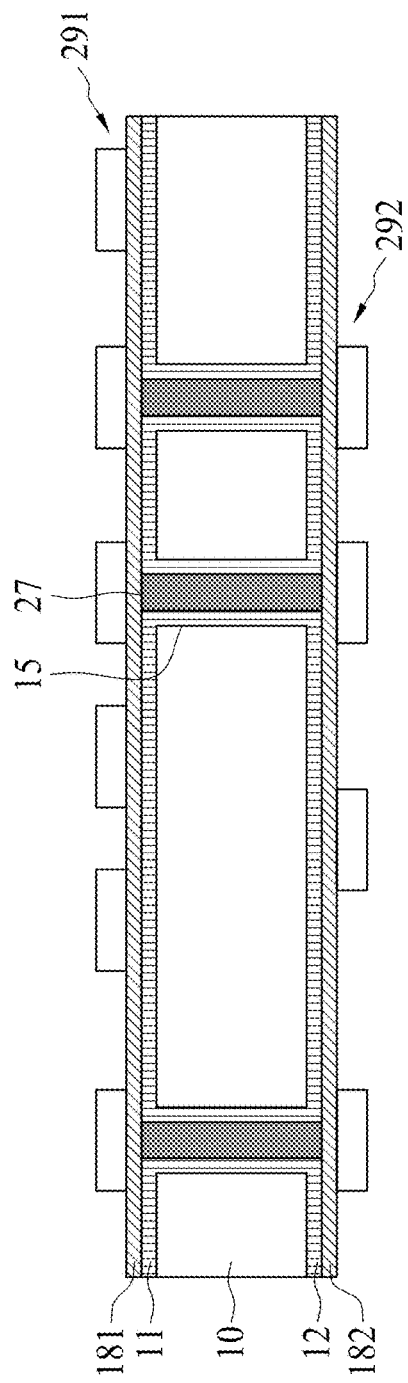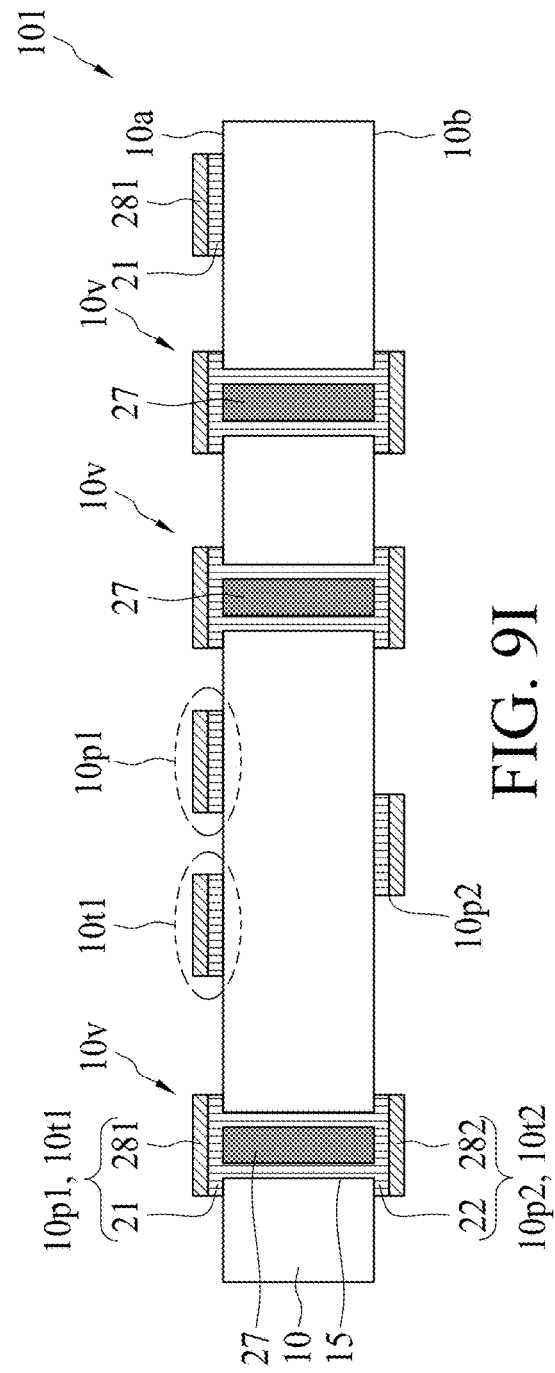

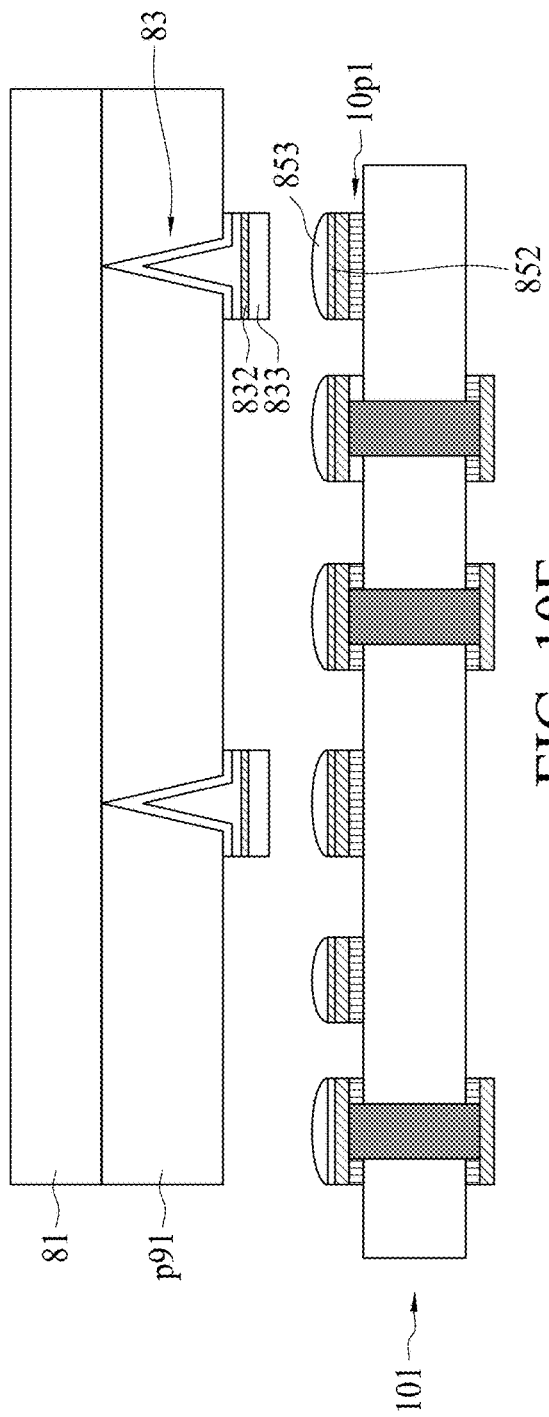
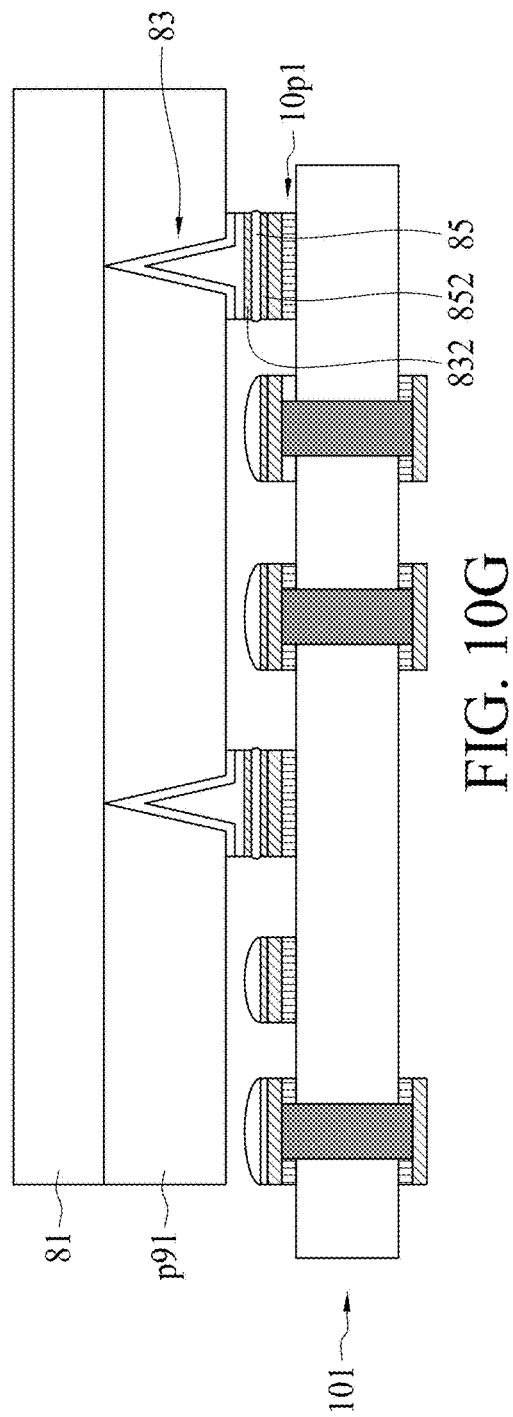

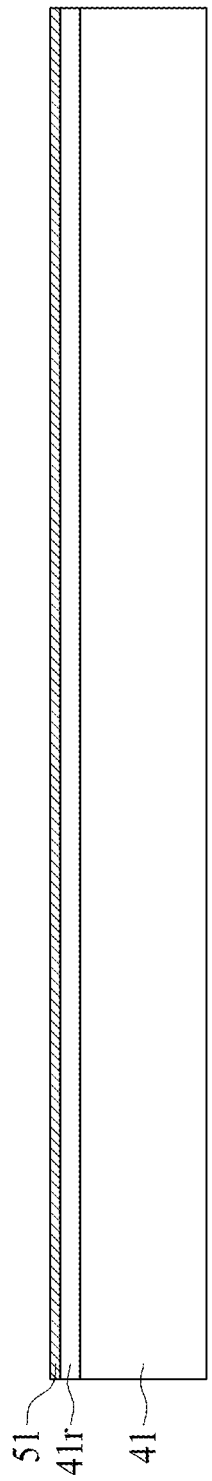
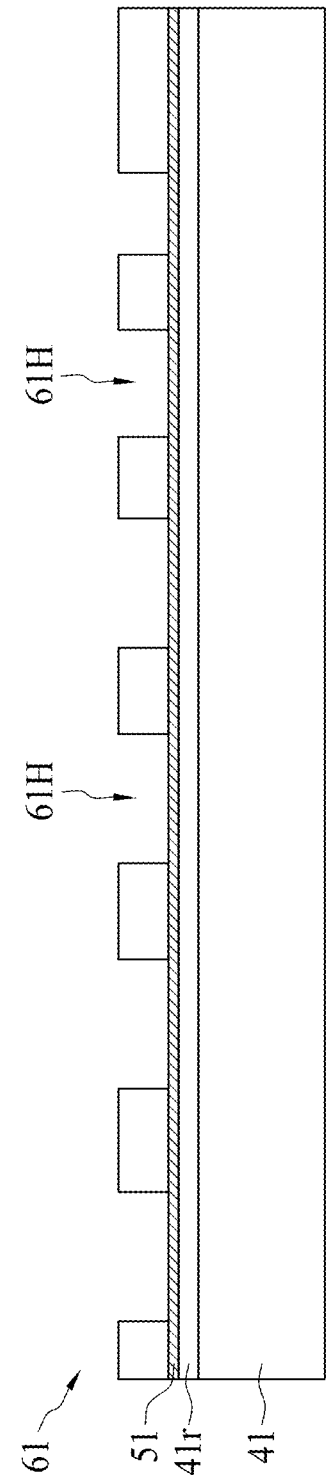
FIG. 11A
FIG. 11B

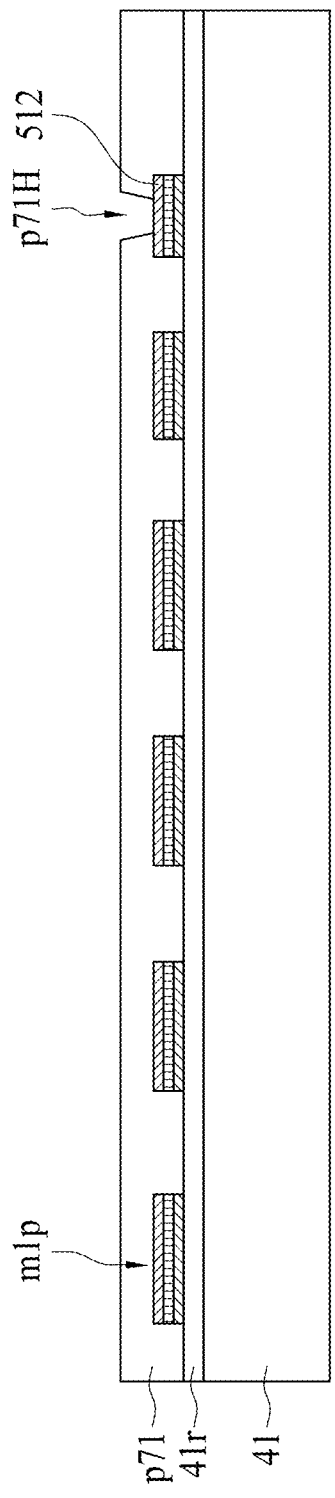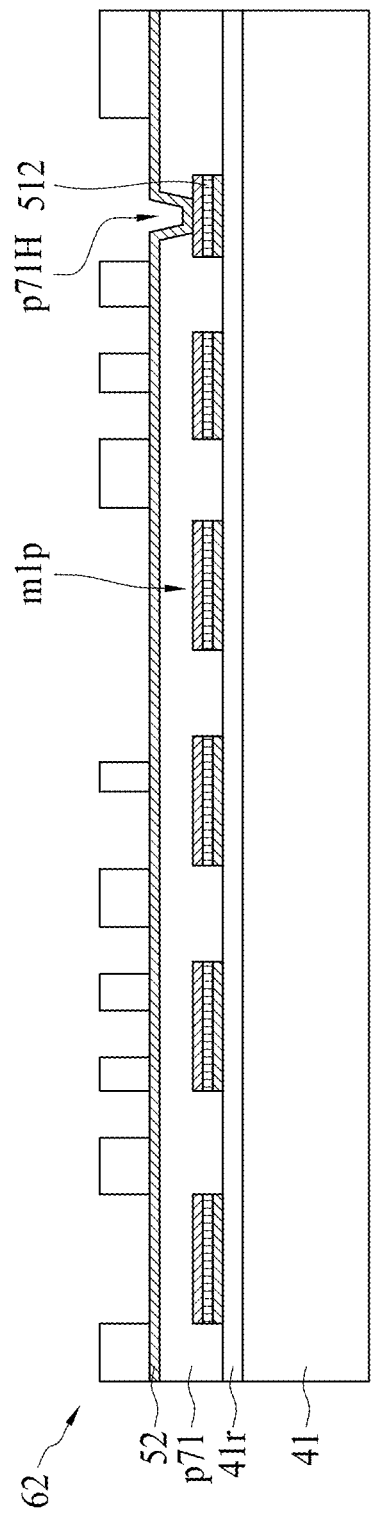

SUBSTRATE STRUCTURE AND METHOD OF MANUFACTURING THE SAME

BACKGROUND

1. Field of the Disclosure

The present disclosure generally relates to a substrate structure and, in particular, to a substrate structure including a substrate and a redistribution structure, and to a method of manufacturing the substrate structure.

2. Description of the Related Art

A semiconductor device package may include a substrate and a redistribution structure attached to the substrate. The redistribution structure includes dielectric layers and one or more conductive layers in the dielectric layers, and may function to provide fan out purposes. The substrate includes conductive pads for electrical connection with the conductive layers in the redistribution layer. Conductive pads or traces associated with a substrate are larger in line width and line spacing (L/S) than those associated with a redistribution structure.

SUMMARY

Embodiments of the present disclosure provide a substrate structure that includes a substrate including a first conductor on a first surface of the substrate, a first redistribution structure disposed over the substrate, a first adhesive layer between the substrate and the first redistribution structure, and a first connecting component, electrically connected with the first conductor, penetrating through the first adhesive layer into the first redistribution structure and electrically connecting the substrate to the first redistribution structure.

Some embodiments of the present disclosure provide a method of manufacturing a substrate structure. The method includes providing a substrate plate having a first surface, forming a first conductor on the first surface, forming a first connecting component on the first conductor, wherein the first connecting component includes a tip portion, providing a first redistribution structure, and combining the substrate and the first redistribution structure by thrusting the first connecting component at the tip portion into the first redistribution structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 5A, FIG. 5B and FIG. 5C are cross-sectional views of substrate structures in accordance with some embodiments of the present disclosure.

FIG. 6A and FIG. 6B are cross-sectional views of substrate structures in accordance with some embodiments of the present disclosure.

FIG. 9A, FIG. 9B, FIG. 9C, FIG. 9D, FIG. 9E, FIG. 9F, FIG. 9G, FIG. 9H, and FIG. 9I illustrate one or more stages of a method of manufacturing a substrate as illustrated in FIG. 1, in accordance with an embodiment of the present disclosure.

FIG. 10A, FIG. 10B, FIG. 10C, FIG. 10D, FIG. 10E, FIG. 10F, FIG. 10G, FIG. 10H, and FIG. 10I illustrate one or more stages of a method of forming a connecting component, in accordance with another embodiment of the present disclosure.

FIG. 11A, FIG. 11B, FIG. 11C, FIG. 11D, FIG. 11E, FIG. 11F, FIG. 11G, FIG. 11H, FIG. 11I, FIG. 11J, and FIG. 11K illustrate one or more stages of a method of manufacturing a redistribution structure as illustrated in FIG. 1, in accordance with an embodiment of the present disclosure.

DETAILED DESCRIPTION

Figure 1:
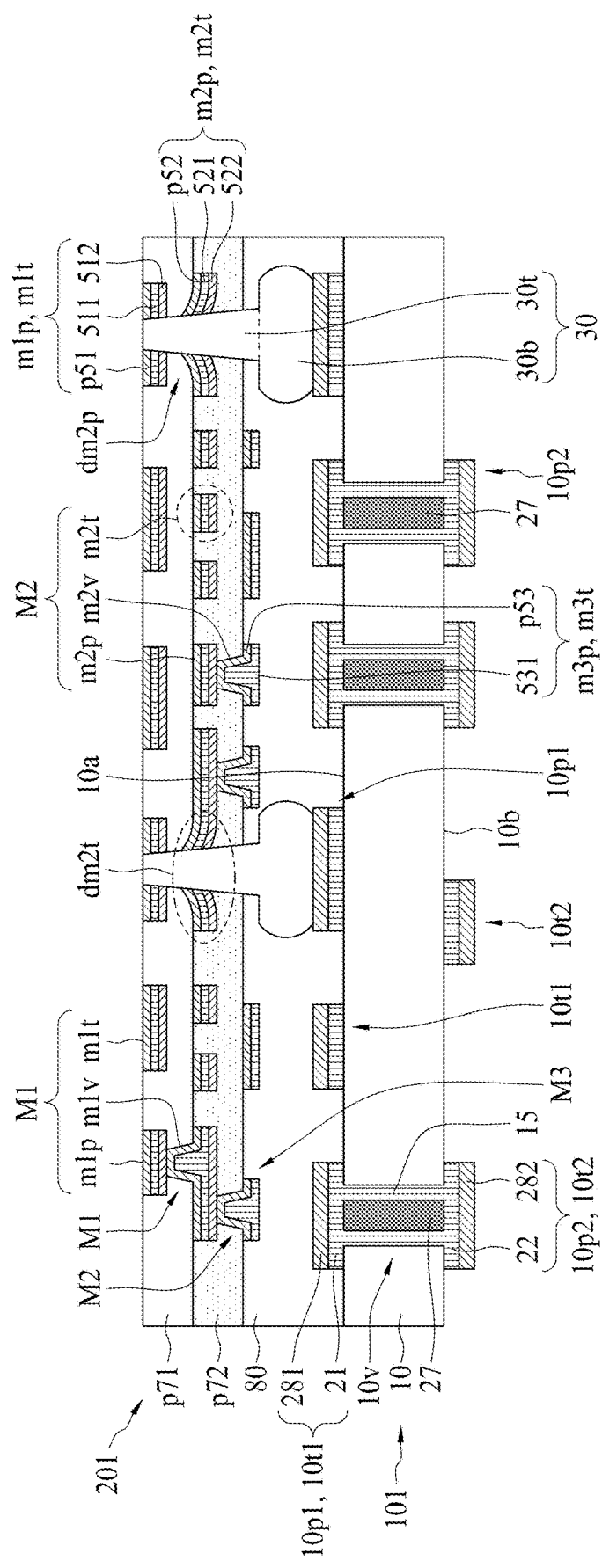
FIG. 1 is a cross-sectional view of a substrate structure in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Along with the rapid development in electronics industry and the progress of semiconductor processing technologies, semiconductor chips are integrated with an increasing number of electronic components to achieve better electrical performance and more functions. The shrinking design rules and increased number of layers are aspects characterizing the progress in semiconductor devices along with the trend of downsizing and multi-functionalization of electronic devices. Accordingly, semiconductor chips are provided with more input/output (I/O) connections. Redistribution structures serving fan-out thus purposes become popular. A redistribution structure may be formed by a more advanced manufacturing process than a substrate. As a result, a redistribution structure has a relatively fine line width and spacing, while a substrate has a relatively coarse line width and spacing. Moreover, surface uniformity (U %) of a redistribution structure may be significantly different from that of a substrate. Specifically, a redistribution structure has a relatively small variation in thickness between electrodes, and a relatively low U % in dielectric layers. By comparison, a substrate has a relatively large variation in thickness between electrodes, and a relatively high U % in dielectric layers. Consequently, when forming a redistribution structure on a substrate, dis-interconnection between electrodes of the redistribution structure and the substrate is likely to occur. It may therefore be desirable to provide a substrate structure to address the dis-interconnection issue.

FIG. 1 is a cross-sectional view of a substrate structure 100 in accordance with an embodiment of the present disclosure.

Referring to FIG. 1, the substrate structure 100 includes a substrate 101, a redistribution structure 201, an adhesive layer 80 between the substrate 101 and the redistribution structure 201, and one or more connecting components 30 electrically connecting the substrate 101 and the redistribution structure 201.

The substrate 101 includes a substrate plate 10 having a first surface 10a and a second surface 10b opposite to the first surface 10a, and conductive vias 10v extending between the first and second surfaces 10a and 10b. Moreover, the substrate 101 includes first conductive pads 10p1 and first conductive traces 10t1 disposed on the first surface 10a of the substrate plate 10, and second conductive pads 10p2 and second conductive traces 10t2 disposed on the second surface 10b of the substrate plate 10. A conductive pad or trace is called a conductor throughout the present disclosure.

The substrate plate 10 includes dielectric layers, and a wiring structure in the dielectric layers for electrical communication between contact pads or traces on the first surface 10a and the second surface 10b. The dielectric layers in the substrate plate 10 may include organic materials selected from polyamide (PA), polyimide (PI), polybenzoxazole (PBO), FR-4 or an epoxy-based material. In other embodiments, the dielectric layers in the substrate plate 10 may include inorganic materials selected from silicon (Si), glass, ceramic, or an oxidation or nitridation material such as silicon oxide (SiOx), tantalum oxide (TaOx) or silicon nitride (SiNx). The substrate plate 10 may have a thickness ranging from approximately twenty (20) micrometers (μm) to approximately one hundred (100) μm.

Each of the first conductive pads or traces 10p1, 10t1 includes a patterned first metal foil 21 and a patterned first conductive layer 281 stacked thereon. The patterned first metal foil 21 may include titanium (Ti), tungsten (W) or an alloy thereof. In an embodiment, the patterned first metal foil 21 has a thickness ranging from approximately one 1 μm to approximately 5 μm. Moreover, the patterned first conductive layer 281 may include copper (Cu), silver (Ag), gold (Au), nickel (Ni), solder or an alloy thereof. In an embodiment, the patterned first conductive layer 281 has a thickness ranging from approximately 5 μm to approximately 25 μm. The line width and spacing (L/S) for the first conductive pads or traces 10p1, 10t1 are not smaller than approximately 7 μm and 7 μm, respectively.

Each of the second conductive pads or traces 10p2, 10t2 includes a patterned second metal foil 22 and a patterned second conductive layer 282 stacked thereon. The patterned second metal foil 22 may include titanium (Ti), tungsten (W) or an alloy thereof. In an embodiment, the patterned second metal foil 22 has a thickness ranging from approximately one 1 μm to approximately 5 μm. Moreover, the patterned second conductive layer 282 may include copper (Cu), silver (Ag), gold (Au), nickel (Ni), solder or an alloy thereof. In an embodiment, the patterned second conductive layer 282 has a thickness ranging from approximately 5 μm to approximately 25 The line width and spacing (L/S) for the second conductive pads or traces 10p2, 10t2 are not smaller than approximately 7 μm and 7 respectively.

The conductive via 10v includes an insulating portion 27 and a conductive via lining 15 substantially surrounding the insulating portion 27. The conductive via lining 15 electrically connects a patterned first metal foil 21 and a patterned second metal foil 22 of a pair of conductive pads 10p1, 10p2 that corresponds in position to the conductive via lining 15. Suitable materials for the conductive via lining 15 may include copper (Cu), silver (Ag), gold (Au), nickel (Ni), solder or an alloy thereof. In an embodiment, the conductive via 10v has a diameter ranging from approximately 60 μm to approximately 150 μm.

The redistribution structure 201 includes a first dielectric layer p71, a second dielectric layer p72, a first conductive layer M1, a second conductive layer M2 and a third conductive layer M3. The redistribution structure 201 thus has a "2P3M" configuration, which is just exemplary and not limiting. The second dielectric layer p72 is disposed between the first dielectric layer p71 and the adhesive layer 80. Each of the first and second dielectric layers p71, p72 may include an organic material selected from polyamide (PA), polyimide (PI), polybenzoxazole (PBO), FR-4 or an epoxy-based material, or include an inorganic material selected from silicon (Si), glass, ceramic, or an oxidation or nitridation material such as silicon oxide (SiOx), tantalum oxide (TaOx) or silicon nitride (SiNx). In an embodiment, each of the first and second dielectric layers p71, p72 has a thickness ranging from approximately 2 μm to approximately 10 μm.

The first conductive layer M1 is disposed in the first dielectric layer p71. The first conductive layer M1 includes first conductive pads m1p, first conductive traces m1t and first conductive vias m1v. Each of a first conductive pad and trace m1p, m1t further includes a first seed layer p51, a first barrier layer 511 and a first soldering layer 512 that are sequentially arranged in a stack. Suitable materials for the first seed layer p51 may include copper (Cu), silver (Ag), gold (Au), nickel (Ni), palladium (Pd) or an alloy thereof. In an embodiment, the first seed layer 51 has a thickness ranging from approximately 1 μm to approximately 5 μm. Moreover, suitable materials for the first barrier layer 511 may include Ti and W. In an embodiment, the first barrier layer 511 has a thickness ranging from approximately 0.1 μm to approximately 0.5 μm. Furthermore, suitable materials for the first soldering layer 512 may include solder, anisotropic conductive film (ACF) or anisotropic conductive paste (ACP). In addition, the first soldering layer 512 has a thickness ranging from approximately 5 µm to approximately 20 µm.

The second conductive layer M2 is disposed in the second dielectric layer p72. The second conductive layer M2 includes second conductive pads m2p, second conductive traces m2t and second conductive vias m2v. Each of a second conductive pad and trace m2p, m2t further includes a second seed layer p52, a second barrier layer 521 and a second soldering layer 522 that are sequentially arranged in a stack. Suitable materials and dimensions for the second seed layer p52, second barrier layer 521 and second soldering layer 522 are similar to or identical with those for the first seed layer p51, first barrier layer 511 and first soldering layer 512, respectively.

The third conductive layer M3 is disposed on the second dielectric layer p72 and covered in the adhesive layer 80. The third conductive layer M3 includes third conductive pads m3p and third conductive traces m3t. Each of a third conductive pad and trace m3p, m3t further includes a third seed layer p53 and a third barrier layer 531 that are sequentially arranged in a stack. Suitable materials and dimensions for the third seed layer p53 and third barrier layer 531 are similar to or identical with those for the first seed layer p51 and first barrier layer 511, respectively.

In addition, the first conductive via m1v in the first conductive layer M1 includes the second barrier layer 521 and the second seed layer p52 which are disposed in the first dielectric layer p71. Moreover, the second conductive via m2v in the second conductive layer M2 includes the third barrier layer 531 and the third seed layer p53 which are disposed in the second dielectric layer p72.

The line width and spacing (L/S) for the first, second and third conductive layers M1, M2, M3 are smaller than those for the first and second conductive pads or traces 10p1, 10t1 and 10p2, 10t2. In an embodiment, the line width and spacing (L/S) for the first conductive pad and trace m1p, m1t in the first conductive layer M1 are not greater than approximately 2 µm and 2 µm, respectively. Likewise, the line width and spacing (L/S) for the second conductive pad and trace m2p, m2t in the second conductive layer M2 and for the third conductive pad and trace m3p, m3t in the third conductive layer M3 are not greater than approximately 2 µm and 2 µm, respectively.

The adhesive layer 80 is disposed between the substrate 101 and the redistribution structure 201. The adhesive layer 80 functions to attach the redistribution structure 201 to the substrate 101, and serves as a buffer against a thrusting force from a connecting component 30. Suitable materials for the adhesive layer 80 include ACP, ACF, nonconductive paste (NCP), nonconductive film (NCF), PI, epoxy or resin. In an embodiment, the adhesive layer 80 has a thickness ranging from approximately 20 µm to approximately 100 µm.

The connecting component 30 includes a base portion 30b and a tip portion 30t. The base portion 30b is disposed on a conductive pad 10p1 or a conductive trace 10t1 on the first surface 10a of the substrate plate 10, while the tip portion 30t extends substantially in a tapered manner from the base portion 30b. The tip portion 30t has a tapered end or a relatively pointed end that facilitates thrusting through the adhesive layer 80 into the redistribution structure 201. In the present embodiment, the connecting component 30 includes a stud bump, which may be formed by a method described and illustrated with reference to FIG. 9J. In another embodiment, the connecting component includes a pillar, which may be formed by a method described and illustrated with reference to FIGS. 10A to 10I. Suitable materials for the stud-bump type connecting component 30 may include copper (Cu), silver (Ag), gold (Au), nickel (Ni), solder or an alloy thereof. In an embodiment, the connecting component 30 has a thickness and a diameter each ranging from approximately 20 µm to approximately 50 µm.

In thrusting into the redistribution structure 201, the connecting component 30 penetrates the second dielectric layer p72 and then the first dielectric layer p71 to reach the first conductive layer M1 in the redistribution structure 201. As a result, the substrate 101 and the redistribution structure 201 are electrically connected to each other. In a first conductive pad m1p or a first conductive trace m1t in the first conductive layer M1 in electrical connection with the connecting component 30, the first soldering layer 512 and the first barrier layer 511 are pierced, while the first seed layer p51 may not be pierced through. Moreover, the connecting component 30 may penetrate one or more conductive layers in the redistribution structure 201 towards the first conductive layer M1. For example, in the present embodiment, the connecting components 30 penetrate a second conductive trace m2t and a second conductive pad m2p, resulting in a deformed second conductive trace dm2t and a deformed second conductive pad dm2p, respectively. As such, a connecting component 30 may electrically connect the substrate 101 to a desired conductive layer in the redistribution structure 201, and vice versa. A deformed conductive pad or trace includes a raised portion surrounding the tip portion 30t of a connecting component 30.

In some existing approaches, a redistribution structure may be build up on a substrate, which is liable to dis-interconnection due to significant differences in L/S and U % between the redistribution structure and substrate. In the present disclosure, the substrate 101 and the redistribution structure 201 are combined to each other by thrusting a connecting component 30 into the redistribution structure 201. The connecting component 30 may pierce a conductive layer and cause a raised portion. However, the raised portion of the pierced conductive layer remains in electric connection with the connecting component 30. As a result, despite the fact that the substrate 101 and the redistribution structure 201 are manufactured in separate processes and may have significant differences in L/S and U % in conductive layers and dielectric layers, respectively, thrusting of the connecting component 30 ensures a tip portion 30t of the connecting component 30 to reach a desired or predetermined location in the redistribution structure 201, and thus ensures a reliable electrical connection between the substrate 101 and the redistribution structure 201. The dis-interconnection problem that would otherwise occur in the existing approaches are thereby alleviated or solved.

Figure 2A:
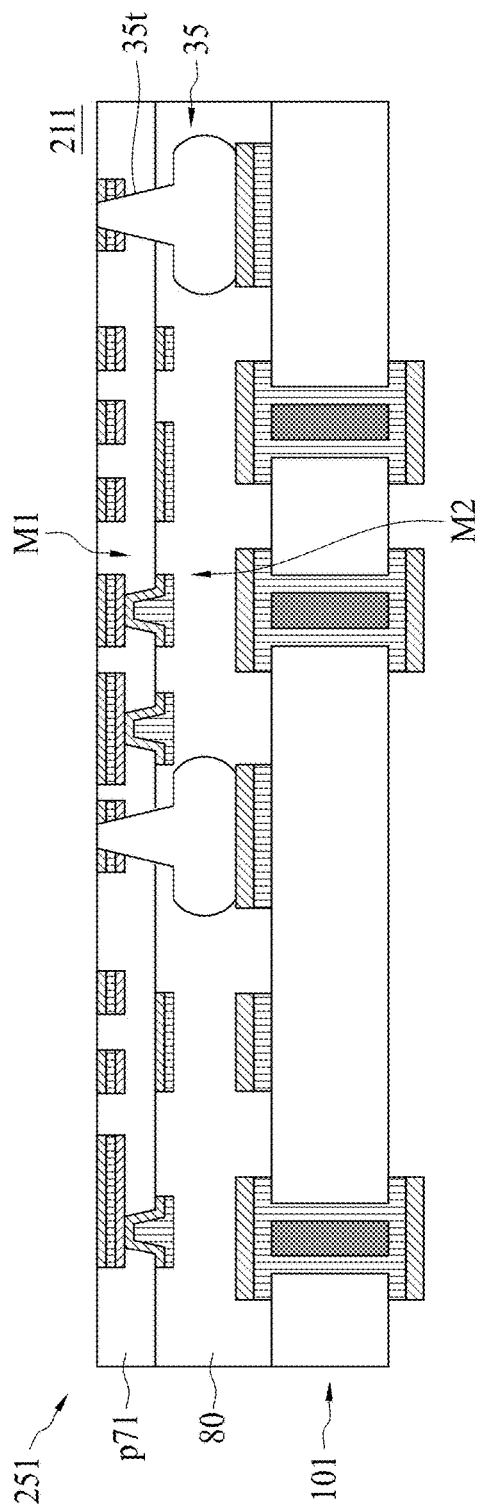
FIG. 2A and FIG. 2B are cross-sectional views of substrate structures in accordance with some embodiments of the present disclosure.
Figure 2B:
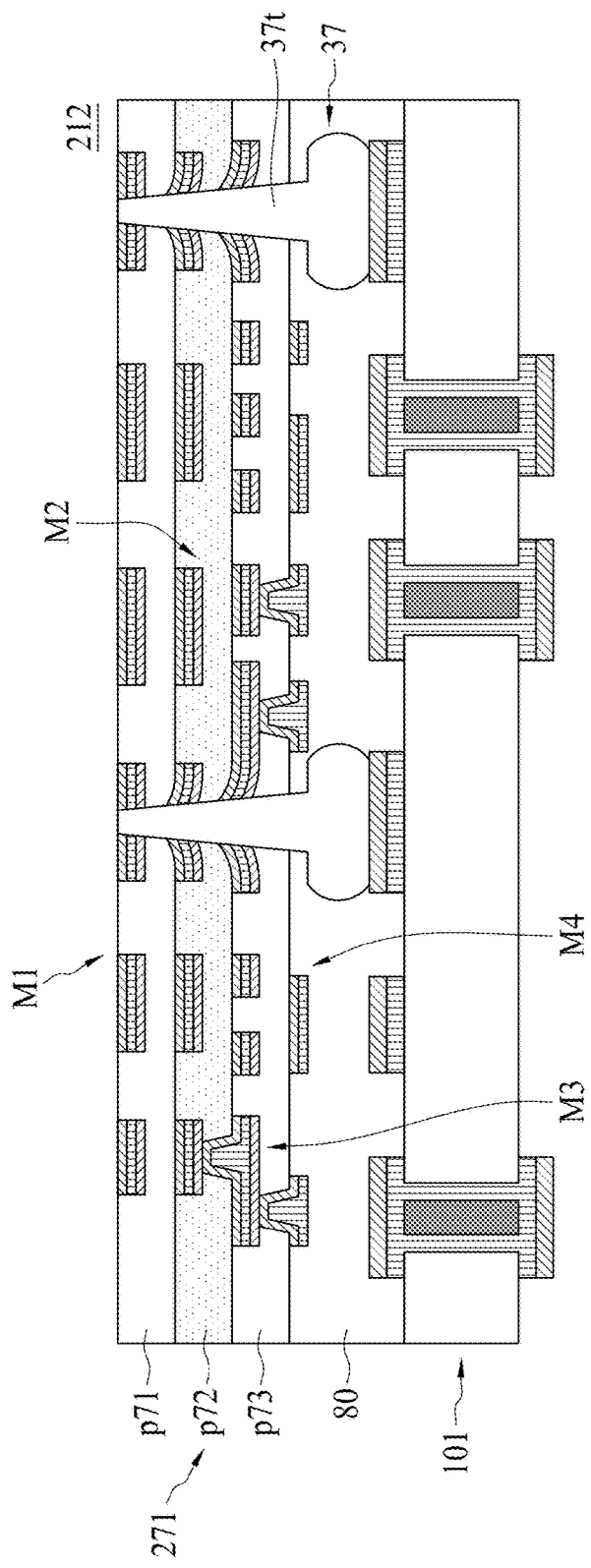

FIGS. 2A and 2B are cross-sectional views of substrate structures 211 and 212, respectively, in accordance with some embodiments of the present disclosure.

Referring to FIG. 2A, the substrate structure 211 is similar to the substrate structure 100 described and illustrated with reference to FIG. 1 except that, for example, a redistribution structure 251 has a "1P2M" configuration different from the "2P3M" configuration of the redistribution structure 201. Specifically, the redistribution structure 251 includes a first dielectric layer p71, a first conductive layer M1 in the first dielectric layer p71, and a second conductive layer M2 disposed on the first dielectric layer p71 and covered in the adhesive layer 80. In addition, the substrate structure 211 includes a connecting component 35 that has a tip portion 35t shorter than tip portion 30t of the connecting component 30.

Referring to FIG. 2B, the substrate structure 212 is similar to the substrate structure 100 described and illustrated with reference to FIG. 1 except that, for example, a redistribution structure 271 has a "3P4M" configuration different from the "2P3M" configuration of the redistribution structure 201. Specifically, the redistribution structure 271 includes a third dielectric layer p73 in addition to the first and second dielectric layers p71, p72, and a fourth conductive layer M4 in addition to the first, second and third conductive layers M1, M2, M3. The third dielectric layer p73 is disposed between the second dielectric layer p72 and the adhesive layer 80. Suitable materials and dimensions for the third dielectric layer p73 are similar to or identical with those for the first dielectric layer p71. Moreover, the fourth conductive layer M4 is disposed on the third dielectric layer p73 and covered in the adhesive layer 80. Suitable materials and dimensions for the fourth conductive layer M4 are similar to or identical with those for the first conductive layer M1. In addition, the substrate structure 212 includes a connecting component 38 that has a tip portion 37t longer than tip portion 30t of the connecting component 30.

Figure 3:
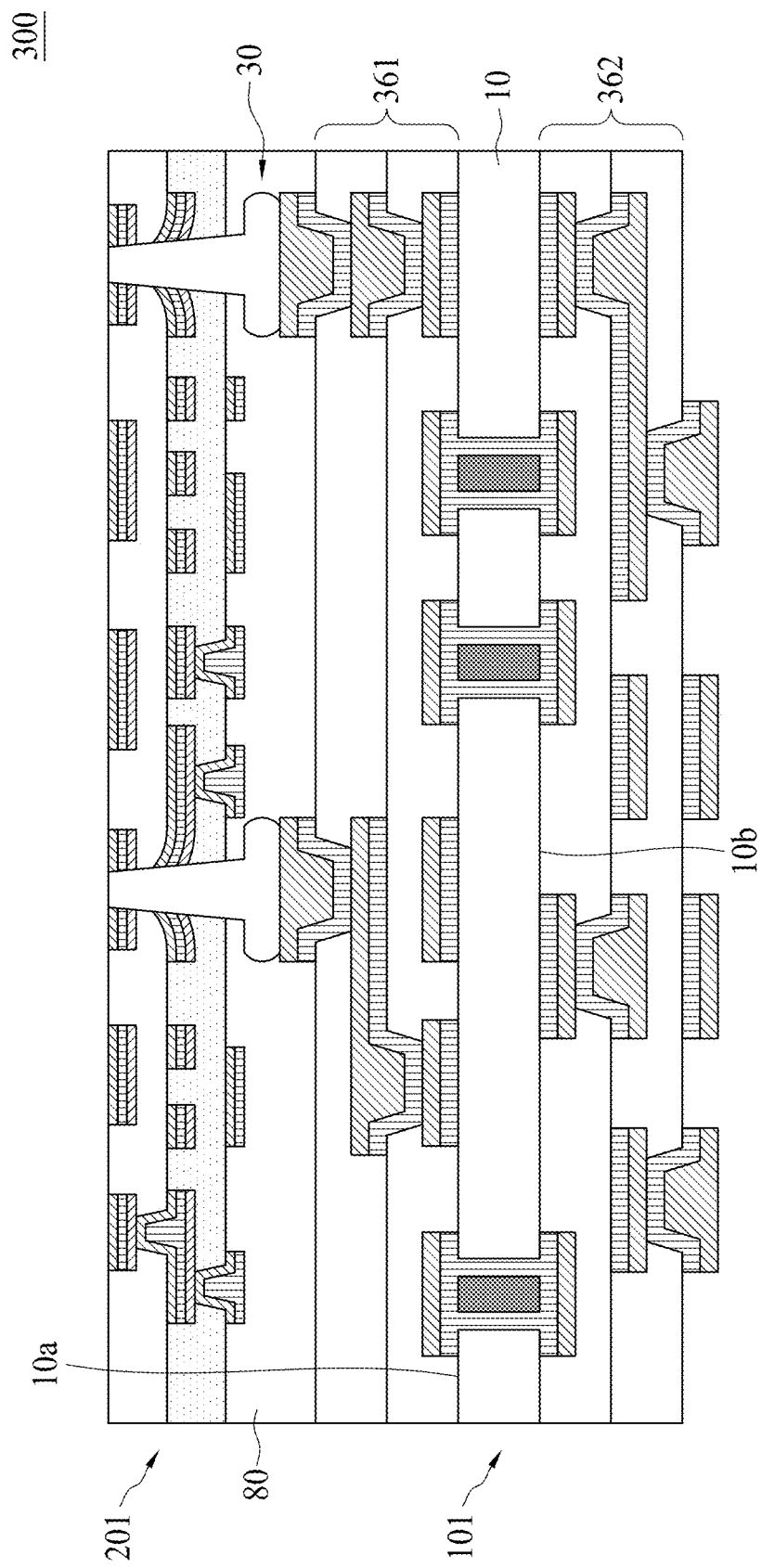
FIG. 3 is a cross-sectional view of a substrate structure in accordance with another embodiment of the present disclosure.

FIG. 3 is a cross-sectional view of a substrate structure 300 in accordance with another embodiment of the present disclosure.

Referring to FIG. 3, the substrate structure 300 is similar to the substrate structure 100 described and illustrated with reference to FIG. 1 except, for example, including an additional routing layer. Specifically, the substrate structure 300 includes a first routing structure 361 disposed on the first surface 10a of the substrate plate 10 between the substrate 101 and the adhesive layer 80. The first routing structure 361 electrically connects the substrate 101 to a connecting component 30. The substrate structure 300 may also include a second routing structure 362 disposed on the second surface 10b of the substrate plate 10. Each of the first and second routing structures 361, 362 may include one or more dielectric layers and a wiring structure routing through the one or more dielectric layers towards the redistribution structure 201.

Figure 4:
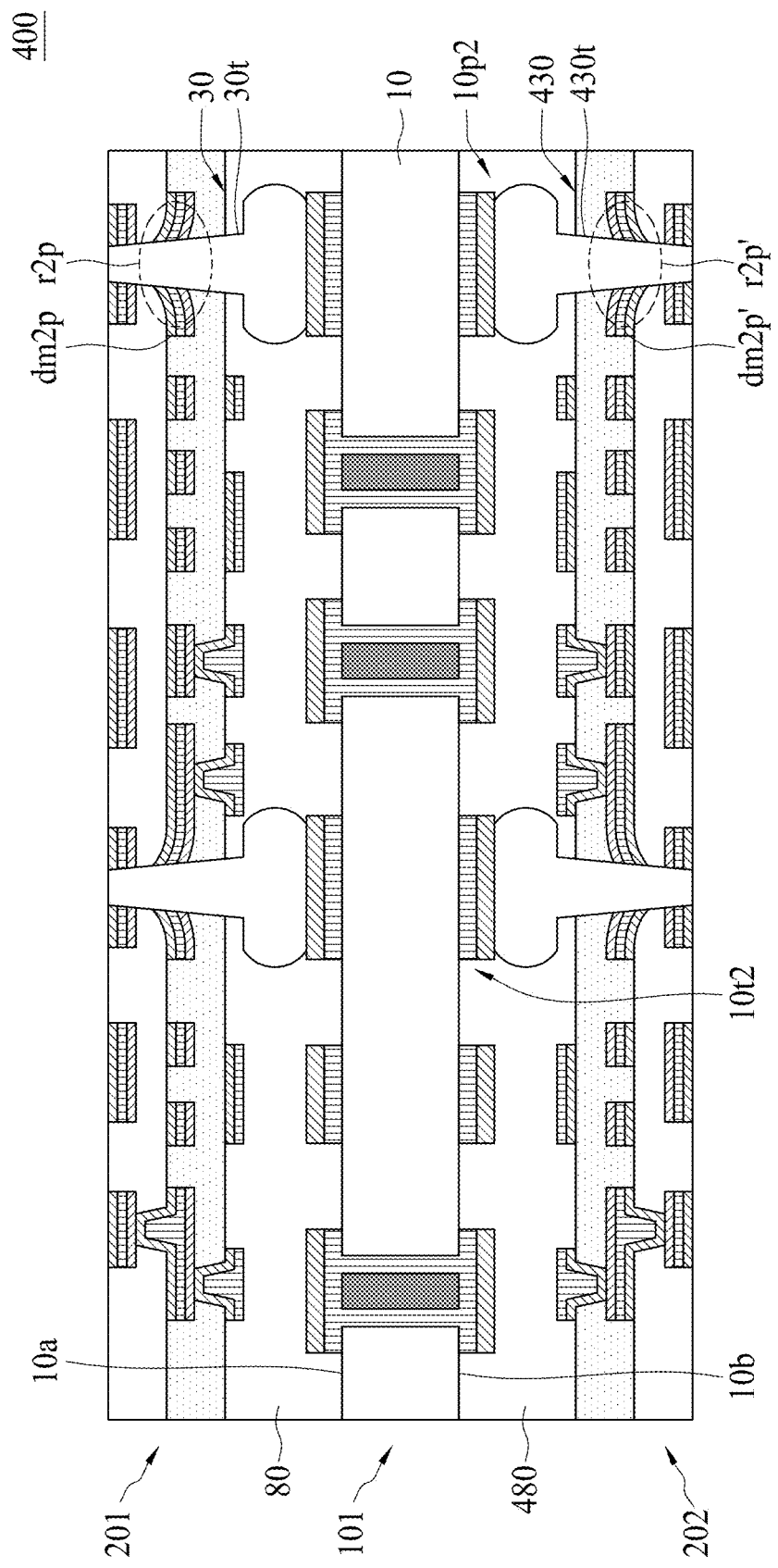
FIG. 4 is a cross-sectional view of a substrate structure in accordance with yet another embodiment of the present disclosure.

FIG. 4 is a cross-sectional view of a substrate structure 400 in accordance with yet another embodiment of the present disclosure.

Referring to FIG. 4, the substrate structure 400 is similar to the substrate structure 100 described and illustrated with reference to FIG. 1 except, for example, including a second redistribution structure 202 in addition to the redistribution structure 201 (in the present case the first redistribution structure 201). The second redistribution structure 202, disposed under the second surface 10b of the substrate plate 10, is attached to the substrate 101 by a second adhesive layer 480. The second adhesive layer 480, disposed on the second surface 10b of the substrate plate 10 between the substrate 101 and the second redistribution structure 202, includes substantially the same materials as the first adhesive layer 80. In the present embodiment, the second redistribution structure 202 includes substantially the same configuration, e.g., the 2P3M configuration, as the first redistribution structure 201. In other embodiments, however, the second redistribution structure 202 may include a different configuration, such as a 1P2M configuration as illustrated in FIG. 2A, or a 3P4M configuration as illustrated in FIG. 2B. The substrate structure 400 further includes a second connecting component 430, which electrically connects the substrate 101 and the second redistribution structure 202. The second connecting component 430 includes a tip portion 430t. In the present embodiment, the tip portion 430t is substantially equal in length to the tip portion 30t of the first connecting component 30. In other embodiments, however, the tip portion 430t may be shorter or longer than the tip portion 30t of the connecting component 30 (in the present case the first connecting component 30), as in the embodiments shown in FIGS. 2A and 2B, respectively.

In the present embodiment, a deformed second conductive pad dm2p in the first redistribution structure 201 includes a raised portion r2p extending along a direction in which the first connecting component 30 thrusts. The raised portion r2p surrounds the tip portion 30t of the first connecting component 30. Similarly, a deformed second conductive pad dm2p' in the second redistribution structure 202 includes a raised portion r2p' extending along a direction in which the second connecting component 430 thrusts. The raised portion r2p' surrounds the tip portion 430t of the second connecting component 430.

Figure 5C:
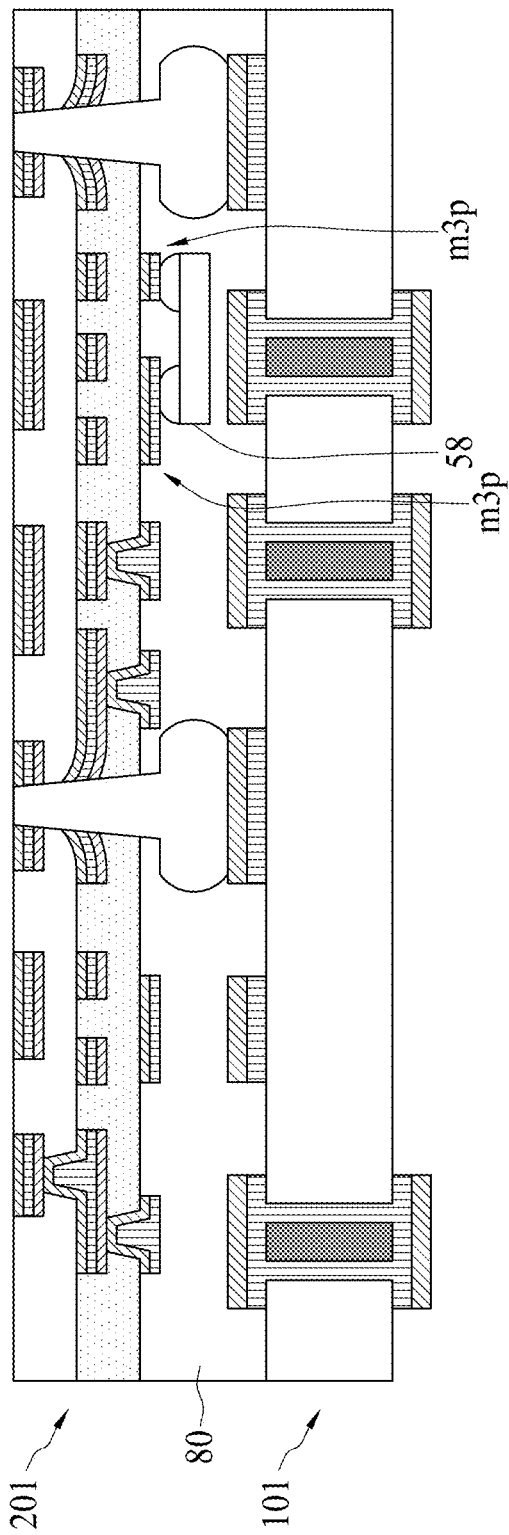

FIGS. 5A, 5B and 5C are cross-sectional views of substrate structures 501, 502 and 503, respectively, in accordance with some embodiments of the present disclosure.

Referring to FIG. 5A, the substrate structure 501 is similar to the substrate structure 100 described and illustrated with reference to FIG. 1 except that, for example, conductive pads or traces are electrically connected by bonding wires. Specifically, in the present embodiment, a first conductive pad 10t1 or trace 10t1 is electrically connected to another first conductive pad 10p1 or trace 10t1 by a bonding wire 51w. Moreover, a third conductive pad m3p or trace m3t is electrically connected to another third conductive pad m3p or trace m3t by a bonding wire 52w. The bonding wires 51w and 52w facilitate electrical connection between conductive pads or traces disposed on a same conductive layer.

Referring to FIG. 5B, the substrate structure 502 is similar to the substrate structure 100 described and illustrated with reference to FIG. 1 except, for example, further including a pillar 57. In the present embodiment, the pillar 57 is connected between a first conductive pad 10p1 and a third conductive pad m3p, which correspond in position to each other. The pillar 57 functions to mechanically strengthen the substrate structure 502, and may not provide electrical connection between conductive pads or traces connected thereto.

Referring to FIG. 5C, the substrate structure 503 is similar to the substrate structure 100 described and illustrated with reference to FIG. 1 except, for example, further including a device 58. In the present embodiment, the device 58 is electrically connected between third conductive pads m3p. The device 58 may include a chip or a passive component.

FIGS. 6A and 6B are cross-sectional views of substrate structures 601 and 602, respectively, in accordance with some embodiments of the present disclosure.

Referring to FIG. 6A, the substrate structure 601 is similar to the substrate structure 100 described and illustrated with reference to FIG. 1 except, for example, including connecting components having a different length from the connecting component 30. Specifically, in the present embodiment, a first connecting component 61 includes a shorter tip portion 61t than the tip portion 30t of the connecting component 30. The first connecting component 61 pierces a third conductive pad m3p, causing a raised portion r3p of the third conductive pad m3p to extend into the second dielectric layer p72. Moreover, a second connecting component 62 includes a tip portion 62t shorter than the tip portion 30t of the connecting component 30 and longer than the tip portion 61t of the first connecting component 61. The second connecting component 62 pierces a second conductive pad m2p, causing a raised portion r2p of the second conductive pad m2p to extend into the first dielectric layer p71. As such, these connecting components 30, 61 and 62 electrically connect the substrate 101 to the first, second and third conductive layers M1, M2 and M3, and vice versa.

Referring to FIG. 6B, the substrate structure 602 is similar to the substrate structure 100 described and illustrated with reference to FIG. 1 except, for example, including a conductive via in electrical connection with a connecting component. Specifically, in the present embodiment, a conductive via m2v in the second conductive layer M2 electrically connects a second conductive pad m2p and a third conductive pad m3p. A third connecting component 63, corresponding in position to the conductive via m2v, includes a tip portion 63t that physically contacts the third conductive pad m3p. As a result, the third connecting component 63 electrically connects the substrate 101 via the third conductive pad m3p to the third conductive layer M3, and in addition via the conductive via m2v and the second conductive pad m2p to the second conductive layer M2.

Moreover, a conductive via m1v in the first conductive layer M1 electrically connects a first conductive pad m1p and a second conductive pad m2p. A fourth connecting component 64, corresponding in position to the conductive via m1v, includes a tip portion 64t that physically contacts the second conductive pad m2p. As a result, the fourth connecting component 64 electrically connects the substrate 101 via the second conductive pad m2p to the second conductive layer M2, and in addition via the conductive via m1v and the first conductive pad m1p to the first conductive layer M1. As such, with the help of the conductive vias 63 and 64, the connecting components 63 and 64 electrically connect the substrate 101 to the first, second and third conductive layers M1, M2 and M3, and vice versa.

Figure 7A:
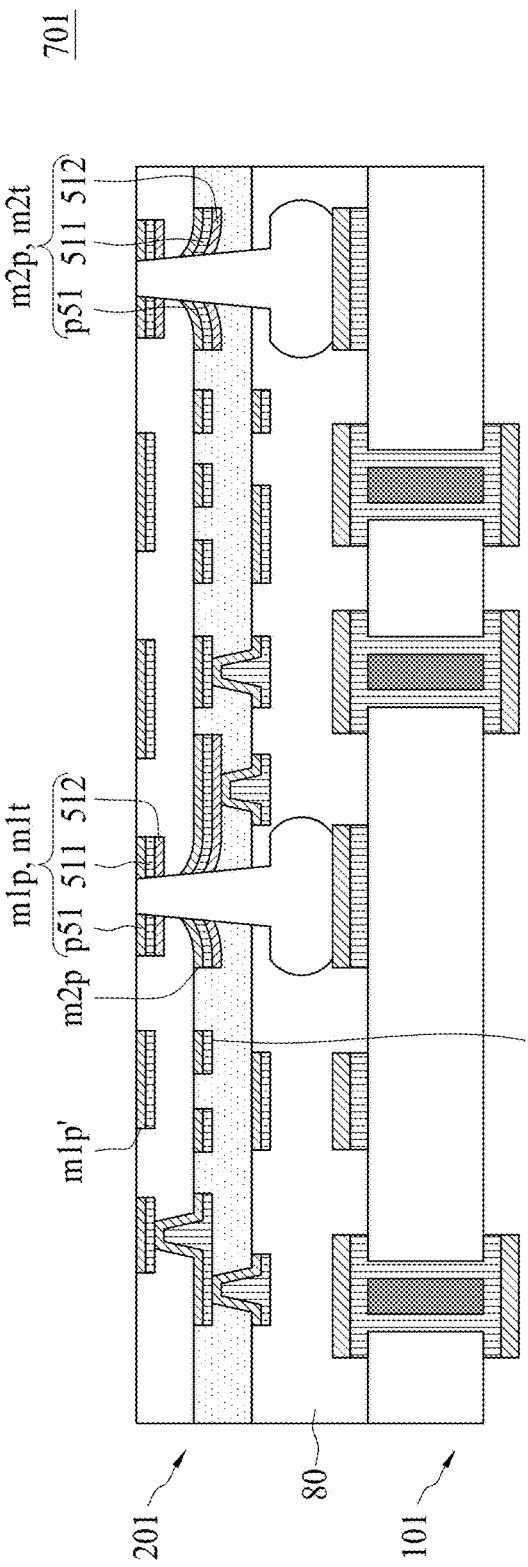
FIG. 7A and FIG. 7B are cross-sectional views of substrate structures in accordance with some embodiments of the present disclosure.
Figure 7B:
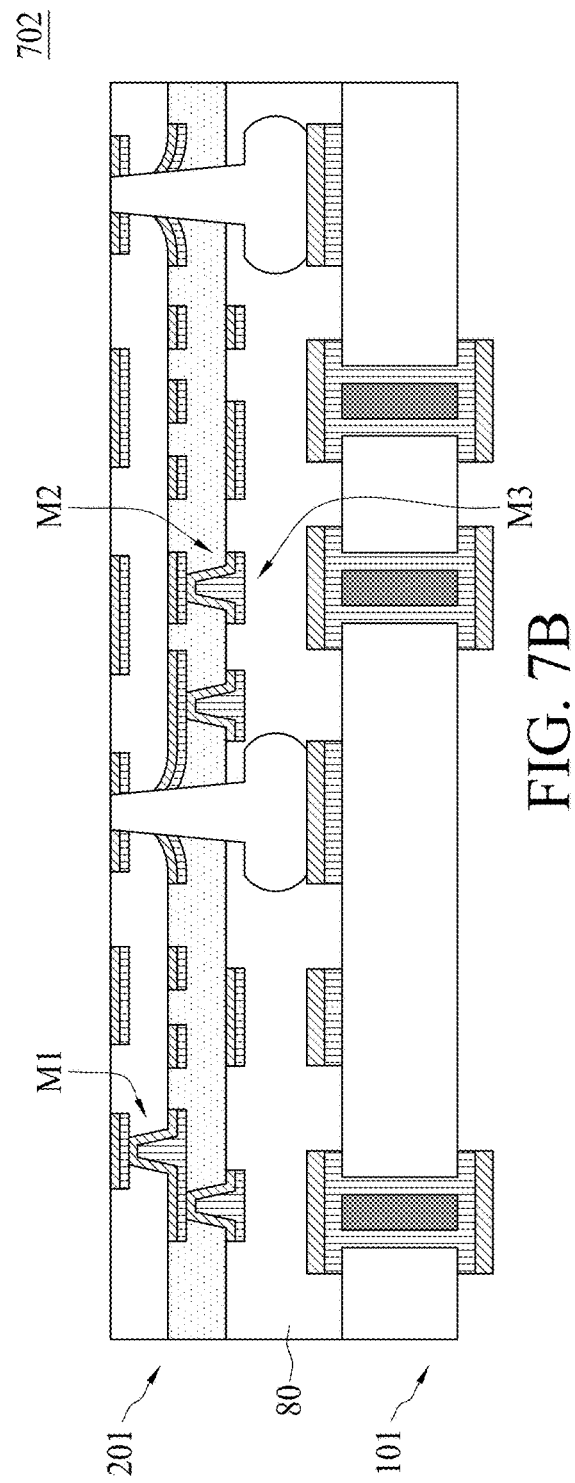

FIGS. 7A and 7B are cross-sectional views of substrate structures 701 and 702, respectively, in accordance with some embodiments of the present disclosure.

Referring to FIG. 7A, the substrate structure 701 is similar to the substrate structure 100 described and illustrated with reference to FIG. 1 except that, for example, a conductive pad or trace may be free of a soldering layer. Specifically, in the present embodiment, while a first conductive pad m1p includes a first soldering layer 512 in addition to a first seed layer p51 and a first buffer layer 511, another first conductive pad m1p' includes only a first seed layer p51 and a first buffer layer 511 and is free of a first soldering layer 512. Likewise, while a second conductive pad m2p includes a second soldering layer 522 in addition to a second seed layer p52 and a second buffer layer 521, another second conductive pad m2p' includes only a second seed layer p52 and a second buffer layer 521 and is free of a second soldering layer 522.

Referring to FIG. 7B, the substrate structure 702 is similar to the substrate structure 100 described and illustrated with reference to FIG. 1 except that, for example, the first, second and third conductive layers M1, M2 and M3 are free of any soldering layers.

Figure 8A:
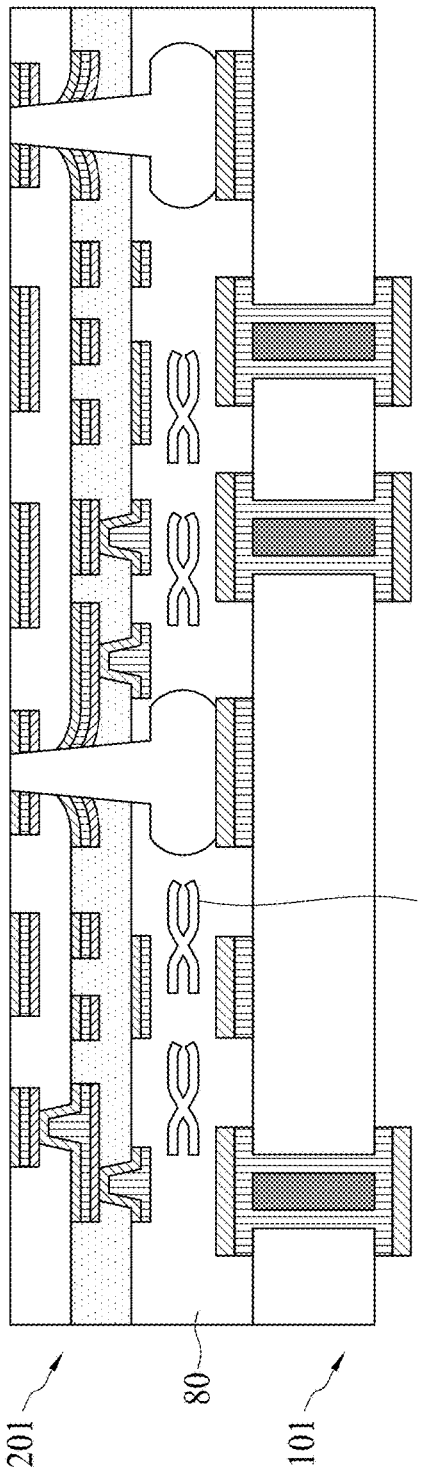
FIG. 8A and FIG. 8B are cross-sectional views of substrate structures in accordance with some embodiments of the present disclosure.
Figure 8B:
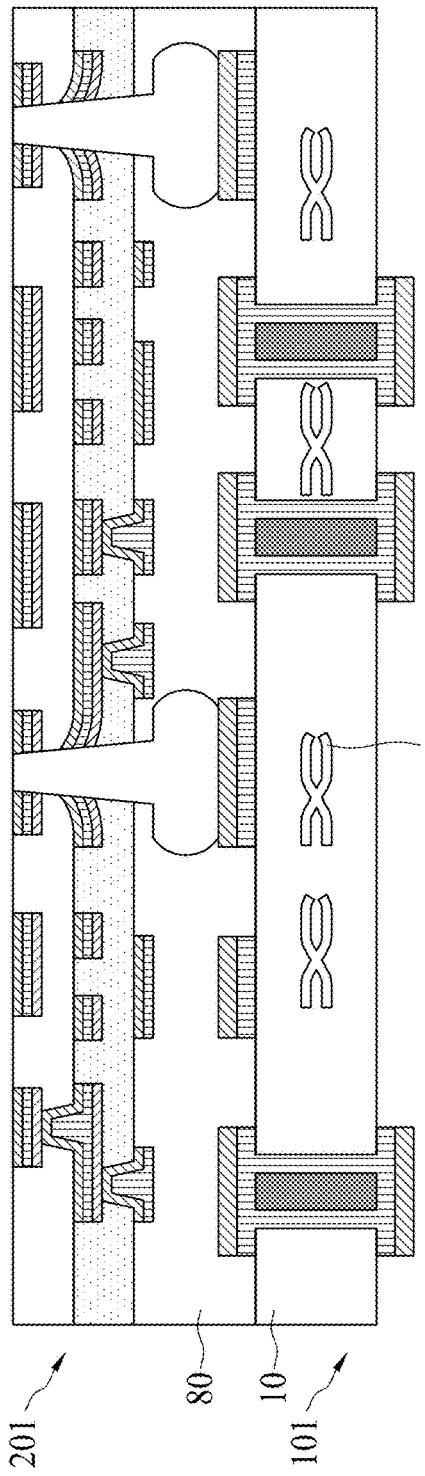

FIGS. 8A and 8B are cross-sectional views of substrate structures 801 and 802, respectively, in accordance with some embodiments of the present disclosure.

Referring to FIG. 8A, the substrate structure 801 is similar to the substrate structure 100 described and illustrated with reference to FIG. 1 except, for example, further including a filler 88 in the adhesive layer 80. The filler 88 functions to mechanically strengthen the substrate structure 801. Suitable materials for the filler 88 may include silicon dioxide particles or glass fibers.

Referring to FIG. 8B, the substrate structure 802 is similar to the substrate structure 801 described and illustrated with reference to FIG. 8A except that, for example, the filler 88 is provided in the substrate plate 10 instead of the adhesive layer 80. In other embodiments, the filler 88 may be provided in both the substrate plate 10 and the adhesive layer 80.

FIG. 9A through FIG. 9I illustrate one or more stages of a method of manufacturing a substrate 101 as illustrated in FIG. 1, in accordance with an embodiment of the present disclosure.

Figure 9A:
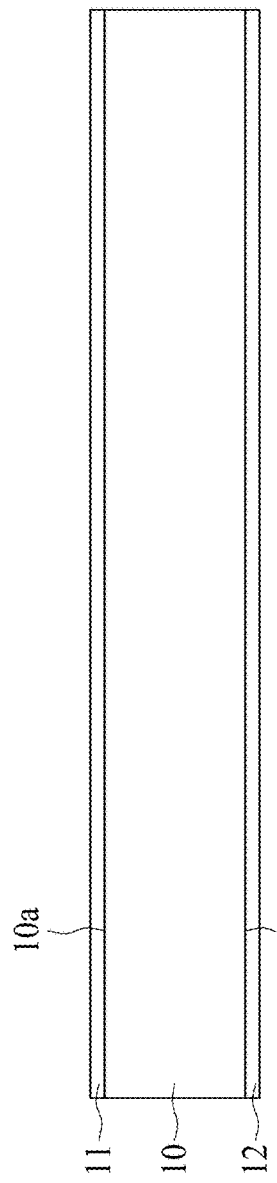

Referring to FIG. 9A, a substrate plate 10 is provided. The substrate plate 10 has a first surface 10a and a second surface 10b opposite to the first surface 10a. Moreover, the substrate plate 10 is provided with a first metal foil 11 and a second metal foil 12 on the first surface 10a and the second surface 10b, respectively. The first metal foil 11 and the second metal foil 12 may each include titanium (Ti), tungsten (W) or an alloy thereof. In addition, the first metal foil 11 and the second metal foil 12 may each have a thickness ranging from approximately one (1) micrometer (μm) to approximately five (5) The substrate plate 10 may include dielectric layers, and a wiring structure in the dielectric layers for electrical communication between contact pads on the first surface 10a and the second surface 10b. The dielectric layers may be formed by using, for example, a lamination, printing, potting or coating process. In some embodiments, the dielectric layers in the substrate plate 10 may include organic materials selected from polyamide (PA), polyimide (PI), polybenzoxazole (PBO), FR-4 or an epoxy-based material. In other embodiments, the dielectric layers in the substrate plate 10 may include inorganic materials selected from silicon (Si), glass, ceramic, or an oxidation or nitridation material such as silicon oxide (SiOx), tantalum oxide (TaOx) or silicon nitride (SiNx). The substrate plate 10 may have a thickness ranging from approximately 20 μm to approximately 100 μm.

Figure 9B:
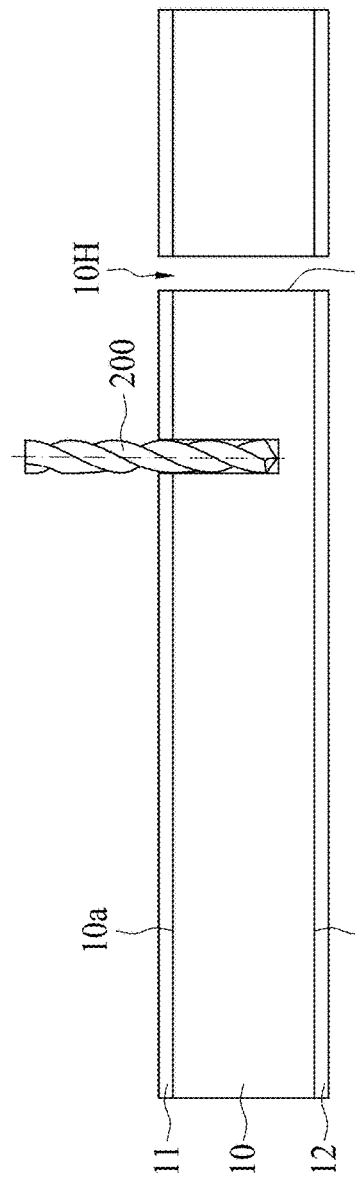

Referring to FIG. 9B, through holes 10H penetrating the substrate plate 10 are formed in a drilling process using, for example, a mechanical driller 200. Each through hole 10H exposes walls 10w of a remaining portion in the substrate plate 10 that defines the each through hole 10H. The through hole 10H may be vertical or tapered. In an embodiment, the through hole 10H has a diameter ranging from approximately 60 μm to approximately 150 μm.

Figure 9C:
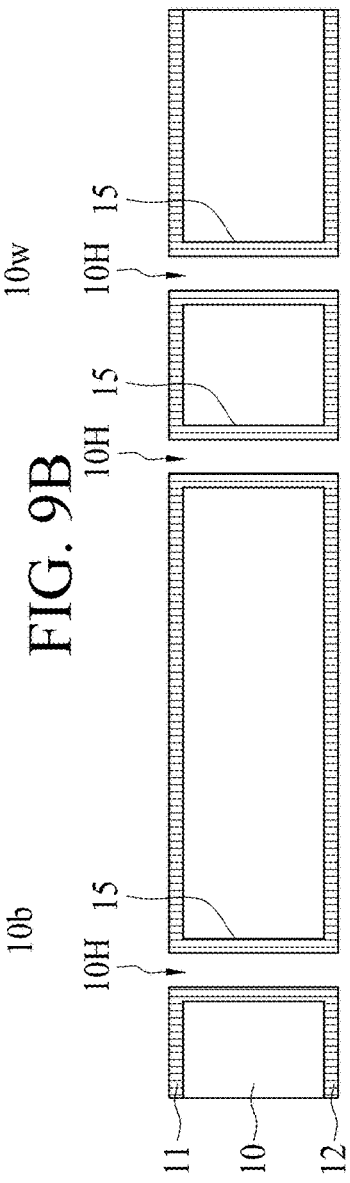

Next, referring to FIG. 9C, an electrically conductive via lining 15 is conformally formed along the walls of the remaining portion in the substrate plate 10 that defines a through hole 10H by using, for example, an electrolytic plating, electroless plating, chemical vapor deposition (CVD), physical vapor deposition (PVD), or other suitable metal deposition process. The conductive via lining 15 electrically connects the first metal foil 11 and the second metal foil 12. Suitable materials for the conductive via lining 15 may include copper (Cu), silver (Ag), gold (Au), nickel (Ni), solder or an alloy thereof.

Figure 9D:
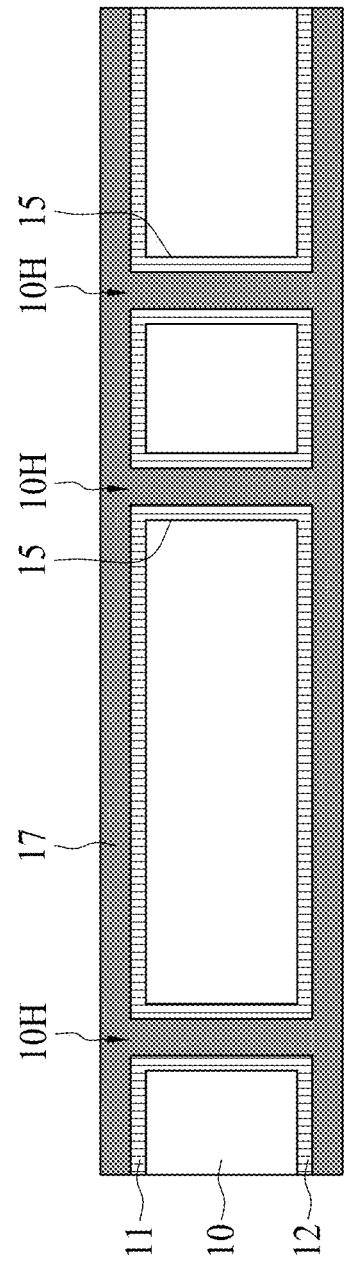

Referring to FIG. 9D, an electrically insulating layer 17 is formed by using, for example, a lamination, printing, potting or coating process. The insulating layer 17 covers the first metal foil 11, the second metal foil 12, and fills the through holes 10H. Suitable materials for the insulating layer 17 may be similar to or identical with those for the dielectric layers in the substrate plate 10, as discussed with reference to FIG. 9A.

Figure 9E:
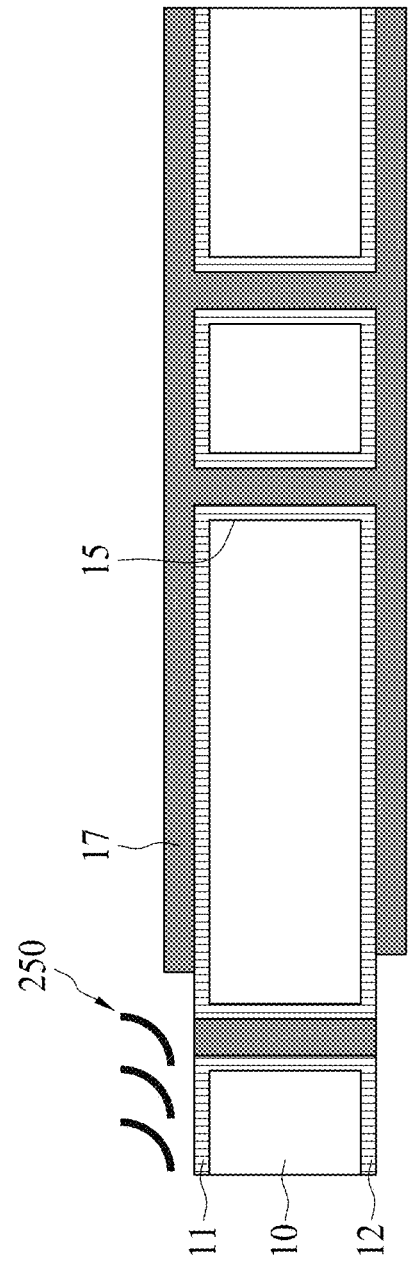

Referring to FIG. 9E, the insulating layer 17 on the first metal foil 11 and the second metal foil 12 is removed by using, for example, a brushing process, exposing the remaining portions 27 of the insulating layer 17 that are filled in the through holes 10H. Each of the insulating portions 27 is substantially flush with the first metal foil 11 and the second metal foil 12.

Figure 9F:
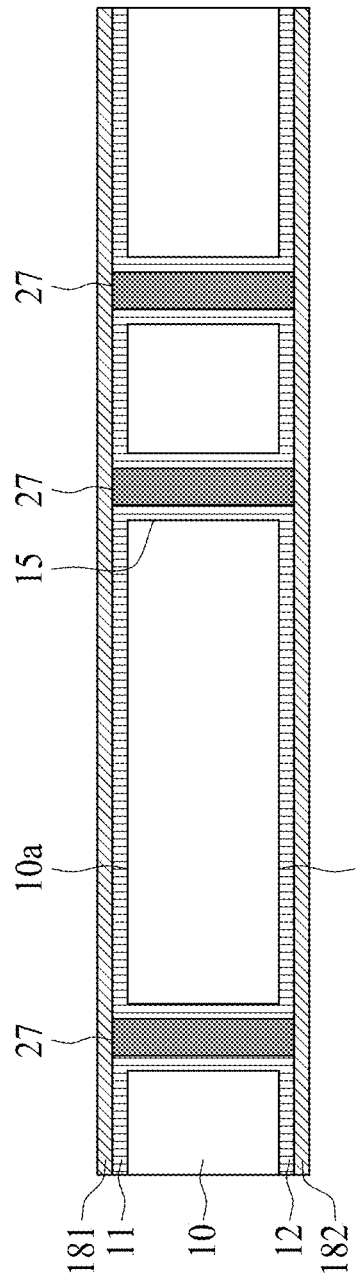

Afterwards, referring to FIG. 9F, a first electrically conductive layer 181 and a second electrically conductive layer 182 are formed on the first metal foil 11 and the second metal foil 12, respectively, by using, for example, a sputtering, electrolytic plating, electroless plating, printing, lamination or potting process. Suitable materials for the first conductive layer 181 and the second conductive layer 182 may each include copper (Cu), silver (Ag), gold (Au), nickel (Ni), solder or an alloy thereof. In an embodiment, the first conductive layer 181 and the second conductive layer 182 may each have a thickness ranging from approximately 5 µm to approximately 25 µm.

Figure 9G:
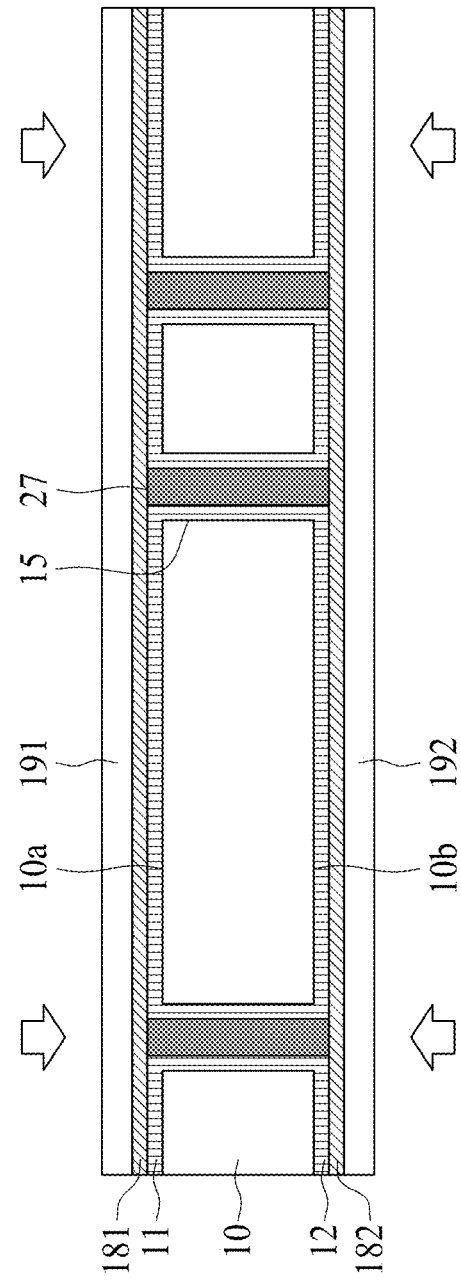

Referring to FIG. 9G, a first photoresist layer 191 and a second photoresist layer 192 are formed on the first conductive layer 181 and the second conductive layer 182, respectively, in a coating process. Next, referring to FIG. 9H, a patterned first photoresist layer 291 and a patterned second photoresist layer 292 are formed on the first conductive layer 181 and the second conductive layer 182, respectively, by patterning the first photoresist layer 191 and the second photoresist layer 192 in a lithography process. The patterned first photoresist layer 291 and patterned second photoresist layer 292 define conductive pads or traces to be subsequently formed on the first surface 10a and the second surface 10b of the substrate plate 10, respectively.

Subsequently, the first conductive layer 181 and the second conductive layer 182 are patterned in an etching process, using the patterned first photoresist layer 291 and the patterned second photoresist layer 292 as masks, resulting in a patterned first conductive layer 281 and a patterned second conductive layer 282, respectively, as shown in FIG. 9I. Further, the first metal foil 11 and the second metal foil 12 illustrated in FIG. 9H are patterned in an etching process, using the patterned first conductive layer 181 and the patterned second conductive layer 182 as masks, resulting in a patterned first metal foil 21 and a patterned second metal foil 22, respectively, as shown in FIG. 9I. The patterned first photoresist layer 291 and the patterned second photoresist layer 292 are then removed, resulting in a substrate structure 101 as described and illustrated with reference to FIG. 1. The patterned first metal foil 21 and the patterned first conductive layer 281 thereon constitute conductive pads 10p1 or conductive traces 10t1 on the first surface 10a of the substrate plate 10. In addition, the patterned second metal foil 22 and the patterned second conductive layer 282 thereon constitute conductive pads 10p2 or conductive traces 10t2 on the second surface 10b of the substrate plate 10. Moreover, a pair of conductive pads 10p1, 10p2 and a conductive lining 15 and a corresponding insulating portion 27 corresponding in position to the pair of conductive pads 10p1, 10p2 together constitute a conductive via 10v, as shown in FIG. 9I. The line width and spacing (L/S) for the conductive pads 10p1, 10p2 and the conductive traces 10t1, 10t2 are not smaller than approximately 7 µm and 7 respectively.

Figure 9J:
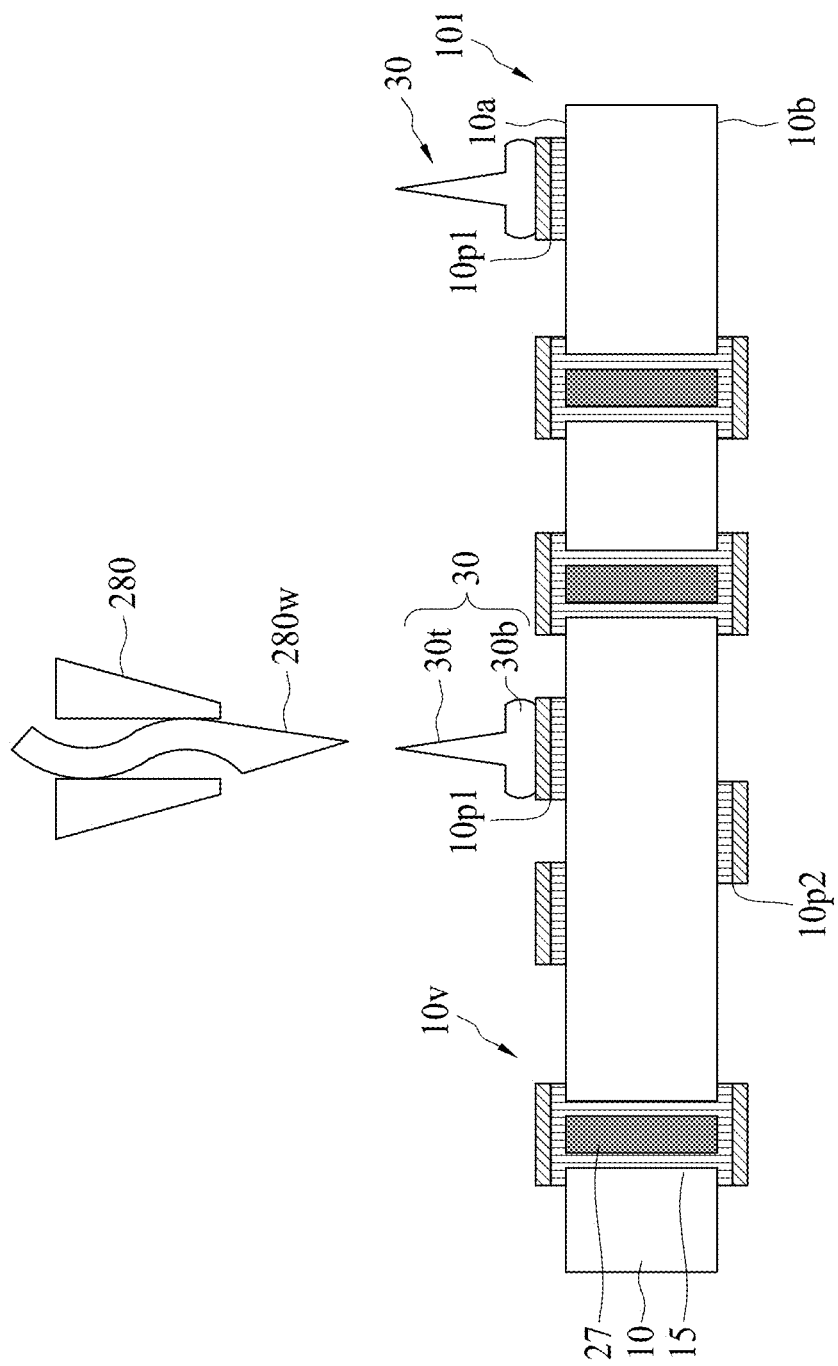
FIG. 9J illustrates one or more stages of a method of forming a connecting component as illustrated in FIG. 1, in accordance with an embodiment of the present disclosure.

FIG. 9J illustrates one or more stages of a method of forming a connecting component 30 as illustrated in FIG. 1, in accordance with an embodiment of the present disclosure.

Referring to FIG. 9J, a connecting component 30 for interconnection is formed on a conductive pad 10p1 or a conductive trace 10t1 on the first surface 10a of the substrate plate 10. The connecting component 30 may be formed by a suitable process that results in a tapered or relatively pointed end to facilitate thrusting into a redistribution structure. In the present embodiment, the connecting component 30 includes a stud bump, which in turn includes a base portion 30b and a tip portion 30t. The base portion 30b is disposed on a conductive pad 10p1 or a conductive trace 10t1, while the tip portion 30t extends substantially in a tapered manner from the base portion 30b. The connecting component 30 is formed by a wire bonding process using, for example, a capillary 280. The size of a connecting component 30, in particular the length of a tip portion 30t, can be predetermined by controlling force and ultrasonic energy applied over time to a bonding wire 280w from the capillary 280. Suitable materials for the stud bump that serves as a connecting component 30 may include copper (Cu), silver (Ag), gold (Au), nickel (Ni), solder or an alloy thereof. In an embodiment, the connecting component 30 has a thickness and a diameter each ranging from approximately 20 µm to approximately 50 µm.

A connecting component suitable for interconnection as the connecting component 30 may be formed by another method in addition to wire bonding. FIG. 10A through FIG. 10I illustrate one or more stages of a method of forming a connecting component 83, in accordance with an embodiment of the present disclosure.

Figure 10A:
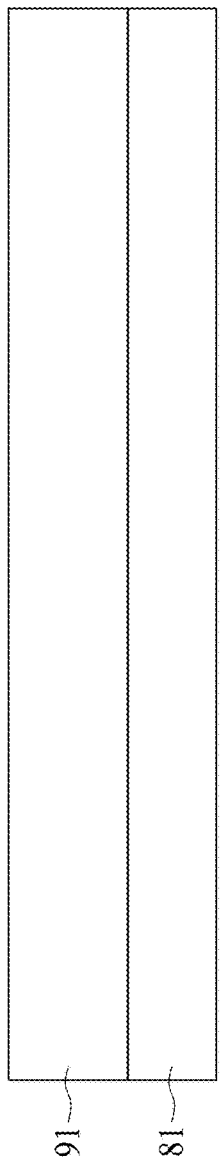

Referring to FIG. 10A, a carrier 81 is provided. Then a first photoresist layer 91 is formed on the carrier 81 in, for example, a lamination process.

Figure 10B:
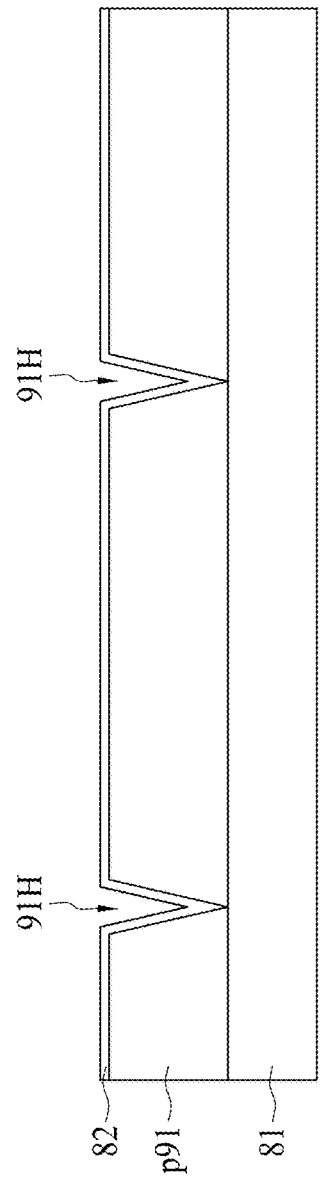

Referring to FIG. 10B, the first photoresist layer 91 is patterned in a lithographic process, resulting in a patterned first photoresist layer p91. The patterned first photoresist layer p91 includes recesses 91H that each defines a tip portion of the connecting component 83 to be later formed. In particular, the recess 91H is tapered from a first surface p91a towards an opposite, second surface p91b of the patterned first photoresist layer p91. Subsequently, a barrier layer 82 is conformally formed on the patterned first photoresist layer p91 in, for example, a physical vapor deposition (PVD) process. Suitable materials for the barrier layer 82 may include titanium (Ti) and tungsten (W). In an embodiment, the barrier layer 82 has a thickness ranging from approximately 0.1 µm to approximately 0.5 µm.

Figure 10C:
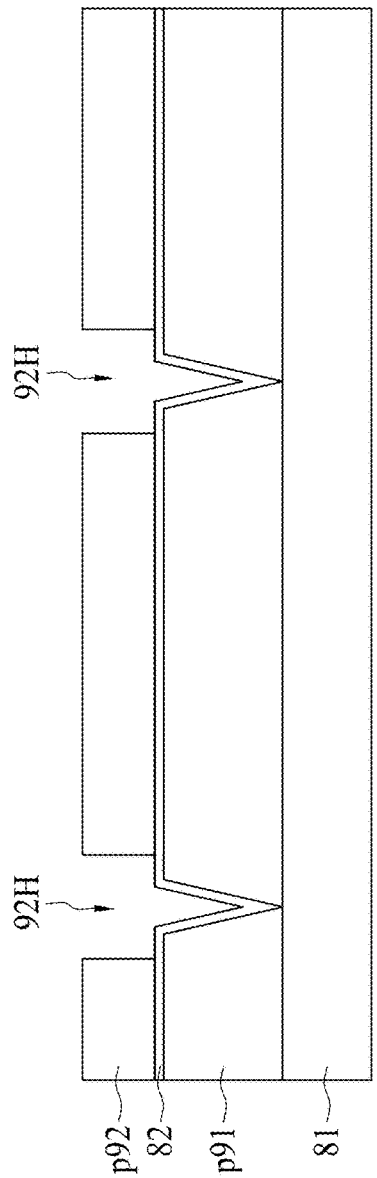

Next, referring to FIG. 10C, a patterned second photoresist layer p92 is formed on the barrier layer 82 in a lithographic process, exposing through openings 92H portions of the barrier layer 82, in particular the barrier layer 82 formed in the recess 91H. The patterned second photoresist layer p92 defines a base portion of the connecting component 83.

Figure 10D:
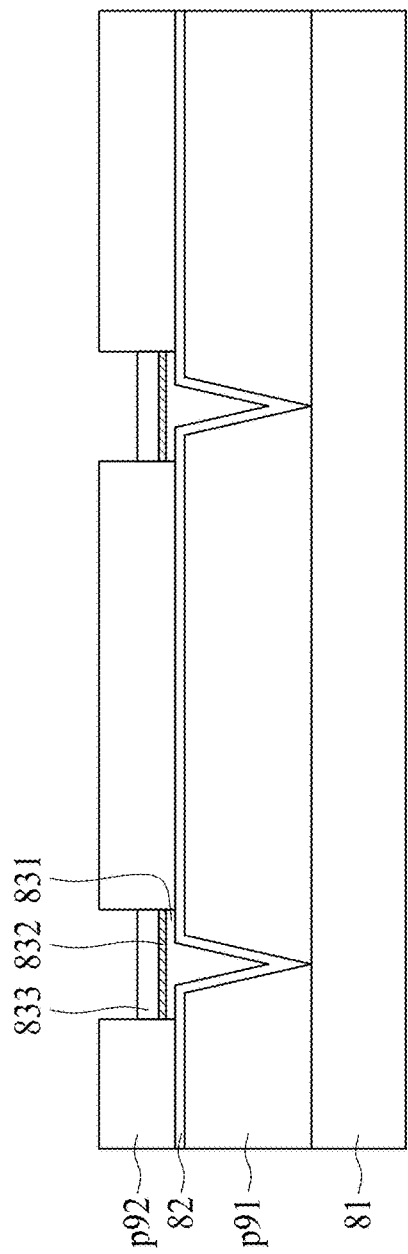

Referring to FIG. 10D, a first conductive layer 831 is formed, by a plating process for example, on the exposed portions of the barrier layer 82, filling the recess 91H. The first conductive layer 831 serves as a base portion and a tip portion of the connecting component 83. Suitable materials for the first conductive layer 831 may include copper (Cu), silver (Ag), gold (Au), nickel (Ni), solder or an alloy thereof.

Then, a second conductive layer 832 is formed on the first conductive layer 831 by, for example, a plating process. The second conductive layer 832 serves as a barrier layer for the connecting component 83. Suitable materials for the second conductive layer 832 may include titanium (Ti) and tungsten (W). In an embodiment, the second conductive layer 832 has a thickness ranging from approximately 0.1 µm to approximately 0.5 µm.

Afterwards, a third conductive layer 833 is formed on the second conductive layer 832 by, for example, a plating process. The third conductive layer 833 serves as a soldering layer for the connecting component 83. Suitable materials for the third conductive layer 833 may include solder, anisotropic conductive film (ACF) or anisotropic conductive paste (ACP). In an embodiment, the third conductive layer 833 has a thickness ranging from approximately 5 µm to approximately 20 µm. Subsequently, the patterned second photoresist layer p92 is removed, exposing portions of the barrier layer 82 unmasked by the third conductive layer 833.

Figure 10E:
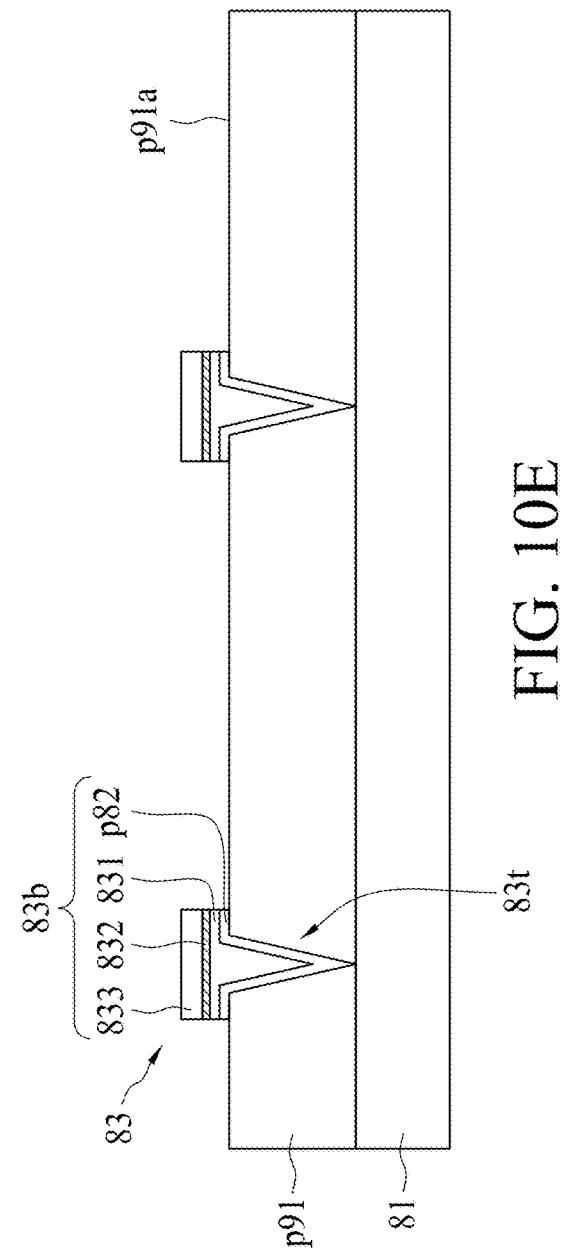

Next, referring to FIG. 10E, the exposed portions of the barrier layer 82 is removed by an etching process, resulting in a patterned barrier layer p82. A portion of the patterned barrier layer p82 that is disposed on a surface p91a of the patterned first photoresist layer p91, and a stack of the first, second and third conductive layers 831, 832 and 833 on the portion of the patterned barrier layer p82 constitute a base portion 83b of a connecting component 83. In addition, the remaining portion of the patterned barrier layer p82 and the first conductive layer 831 in the patterned first photoresist layer p91 constitute a tip portion 83t of the connecting component 83.

Referring to FIG. 10F, a substrate structure 101, which may be prepared according to a method described and illustrated with reference to FIGS. 9A to 9I, is provided. A second conductive layer 852 that serves as a barrier layer, and a third conductive layer 853 that serves as a soldering layer are sequentially formed on a conductive pad 10p1 (or a conductive trace 10t1). Portions of the third conductive layer 853 may correspond in position to third conductive layers 833 of connecting components 83. Suitable processes and materials for the second conductive layer 852 and the third conductive layer 853 that are formed on a conductive pad 10p1 are similar to or identical with those for the second conductive layer 832 and the third conductive layer 833, respectively, of a connecting component 83, as described and illustrated with reference to FIG. 10D.

Then, referring to FIG. 10G, a connecting component 83 is connected to a corresponding conductive pad 10t1 by coupling their respective third conductive layers 833 and 853 in, for example, a reflow process, resulting in a pillar-like connecting component with a joint 85 between the second conductive layers 832 and 852. Subsequently, the carrier 81 and the patterned first photoresist layer p91 are removed.

Figure 10H:
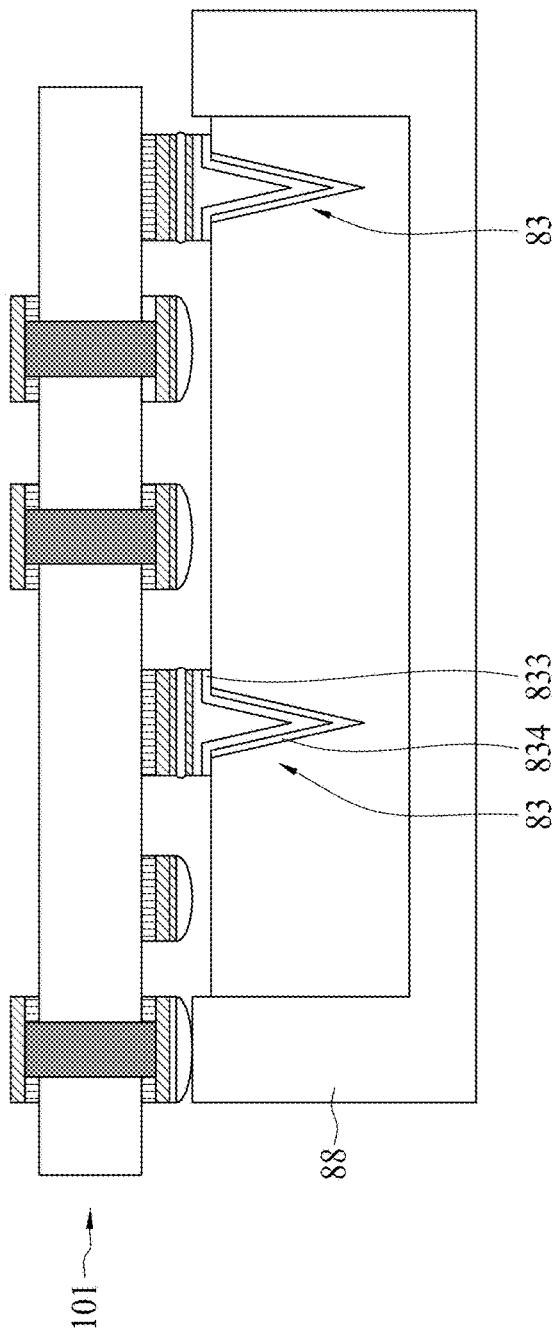
Figure 10I:
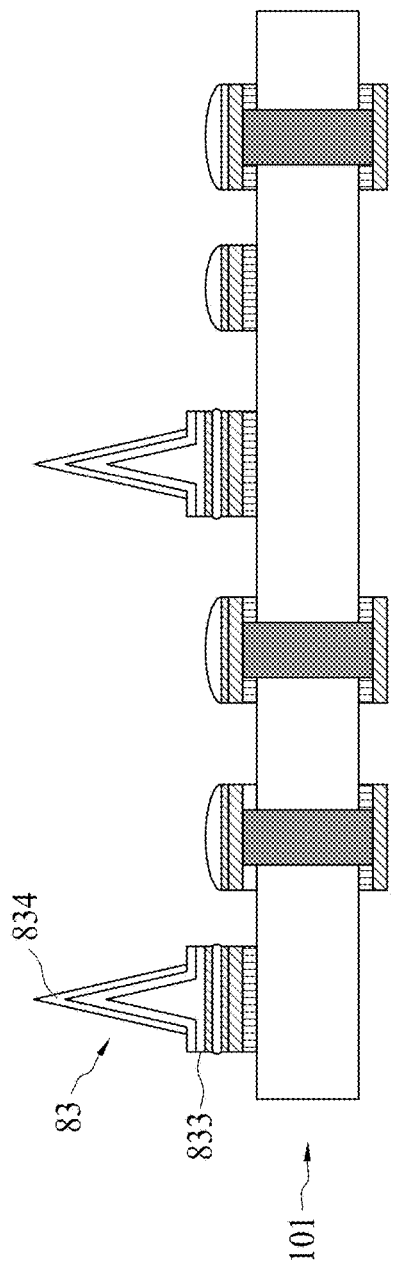

Referring to FIG. 10H, a fourth conductive layer 834 is formed on the third conductive layer 833 of the connecting component 83 by using, for example, an electroless plating process in an aqueous solution. The fourth conductive layer 834 serves as a soldering layer. Suitable materials for the fourth conductive layer 834 may include titanium (Ti) and tungsten (W). A connecting component 83 with the fourth conductive layer 834 is shown in FIG. 10I. In an embodiment, the connecting component 83 has a thickness and a diameter each ranging from approximately 20 µm to approximately 50 µm.

The connecting component 30 in the form of a stud bump as illustrated in FIG. 9J and the connecting component 83 in the form of a pillar as illustrated in FIG. 10I are exemplary connecting components for combining a substrate plate 10 and a redistribution structure 201 as illustrated in FIG. 1. FIG. 11A through FIG. 11K illustrate one or more stages of a method of manufacturing a redistribution structure 201 as illustrated in FIG. 1, in accordance with an embodiment of the present disclosure.

Figure 13:
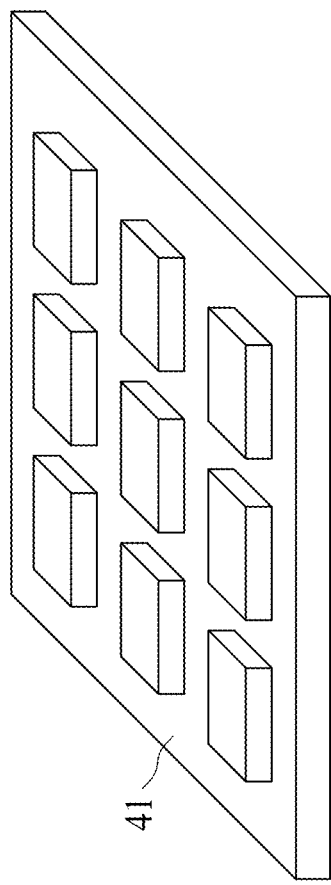
FIG. 13 illustrates a schematic perspective view of a carrier, in accordance with an embodiment of the present disclosure.
Figure 14:
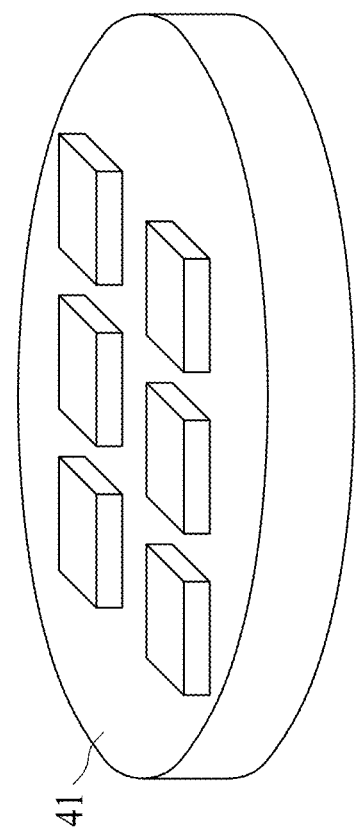
FIG. 14 illustrates a schematic perspective view of a carrier, in accordance with another embodiment of the present disclosure.

Referring to FIG. 11A, a first carrier 41 is provided. The first carrier 41 functions to support semiconductor components, devices or structures to be subsequently formed or disposed thereon. The first carrier 41 may include one of a metal carrier, a ceramic carrier, a glass carrier, a substrate or a semiconductor wafer. In addition, the first carrier 41 may have a rectangular or square shape, as one illustrated in FIG. 13. Alternatively, the first carrier 10 may have a circular or elliptical shape, as one illustrated in FIG. 14. Depending on applications, a thickness of the first carrier 41 may range from approximately 100 µm to approximately 500 µm, from approximately 200 µm to approximately 800 µm, or from approximately 500 µm to approximately 1500 µm.

A first release film 41r is then formed on the first carrier 41. The first release film 41r functions to facilitate release of the first carrier 41 from a semiconductor structure temporarily held by the first carrier 41. In an embodiment, the first release film 202 includes polymer and has a thickness of approximately 0.5 µm.

Afterwards, a first seed layer 51 is formed on the first release film 41r by using, for example, a sputtering, electrolytic plating, electroless plating, printing, lamination or potting process. Suitable materials for the first seed layer 51 may include copper (Cu), silver (Ag), gold (Au), nickel (Ni), palladium (Pd) or an alloy thereof. In an embodiment, the first seed layer 51 has a thickness ranging from approximately 1 µm to approximately 5 µm.

Referring to FIG. 11B, a pattered first photoresist layer 61 is formed on the first seed layer 51, exposing portions of the first seed layer 51 through openings 61H. The pattered first photoresist layer 61 may be formed by forming a photoresist layer on the first seed layer 51 in a coating process followed by a lithographic process including exposure and development.

Figure 11C:
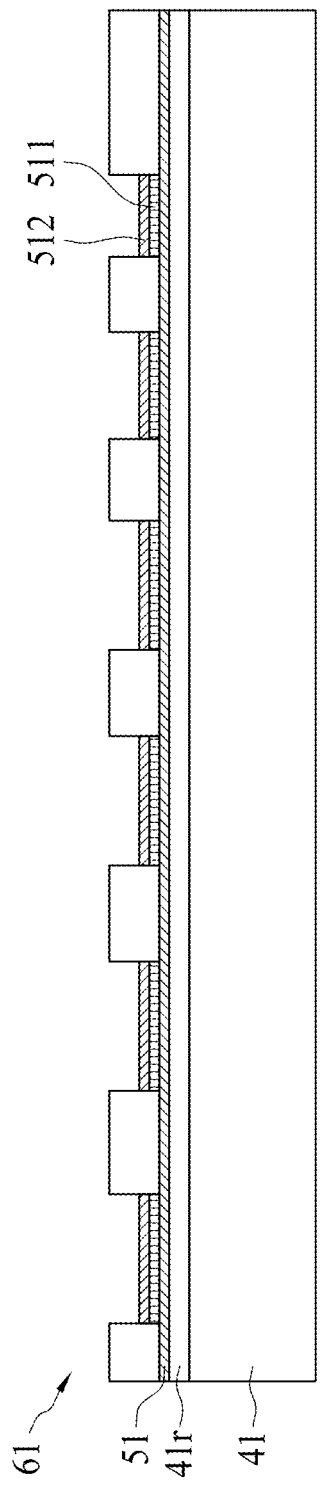

Referring to FIG. 11C, a first barrier layer 511 and a first soldering layer 512 are sequentially formed on the exposed portions of the first seed layer 51 by using, for example, a sputtering, electrolytic plating, electroless plating, printing, lamination or potting process. Suitable materials for the first barrier layer 511 may include Ti and W. Suitable materials for the first soldering layer 512 may include solder, ACF or ACP. In an embodiment, the first barrier layer 511 has a thickness ranging from approximately 0.1 µm to approximately 0.5 µm. In addition, the first soldering layer 512 has a thickness ranging from approximately 5 µm to approximately 20 µm. Afterwards, the pattered first photoresist layer 61 is removed, exposing portions of the first seed layer 51 unmasked by the first barrier layer 511 and the first soldering layer 512.

Figure 11D:
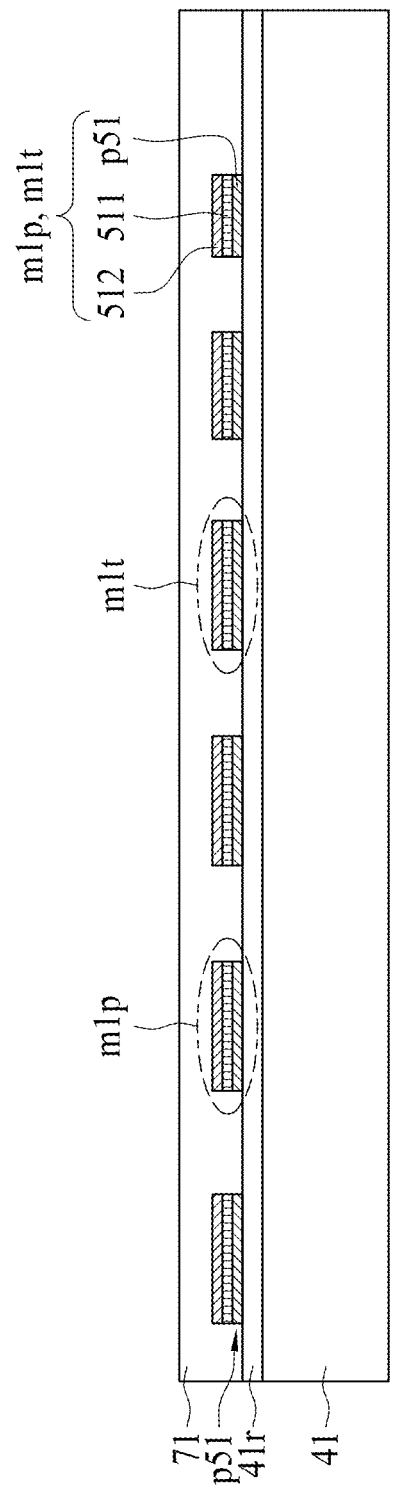

Next, referring to FIG. 11D, the exposed portions of the first seed layer 51 are patterned in an etching process, resulting in a patterned first seed layer p51. The patterned first seed layer p51, the first barrier layer 511 and the first soldering layer 512, formed in a stack, constitute first conductive pads m1p or first conductive traces m1t of a first conductive layer in a redistribution structure under building. The line width and spacing (L/S) for the first conductive pads m1p and the first conductive traces m1t are not greater than approximately 2 µm and 2 µm, respectively.

Subsequently, a first dielectric layer 71 is formed on the first release film 41 in, for example, a printing, lamination, potting or coating process, covering the first conductive pads m1p and the first conductive traces m1t. Suitable materials for the first dielectric layer 71 may include organic materials selected from polyamide (PA), polyimide (PI), polybenzoxazole (PBO), FR-4 or an epoxy-based material, or include inorganic materials selected from silicon (Si), glass, ceramic, or an oxidation or nitridation material such as silicon oxide (SiOx), tantalum oxide (TaOx) or silicon nitride (SiNx). In an embodiment, the first dielectric layer 71 has a thickness ranging from approximately 2 µm to approximately 10 µm.

Referring to FIG. 11E, the first dielectric layer 71 is patterned in a lithographic process, resulting in a patterned first dielectric layer p71. The patterned first dielectric layer p71 exposes portions of the first conductive pads m1p or first conductive traces m1t through openings p71H.

Then, referring to FIG. 11F, a second seed layer 52 is conformally formed on the patterned first dielectric layer p71. Suitable processes, materials and dimensions for forming the second seed layer 52 are similar to or identical with those for forming the first seed layer 51, as described and illustrated with reference to FIG. 11A. Afterwards, a patterned second photoresist layer 62 is formed on the second seed layer 52, exposing portions of the second seed layer 52. In particular, the patterned second photoresist layer 62 exposes the second seed layer 52 disposed in the opening p71H. Suitable processes for forming the patterned second photoresist layer 62 are similar to or identical with those for forming the patterned first photoresist layer 61, as described and illustrated with reference to FIG. 11B.

Figure 11G:
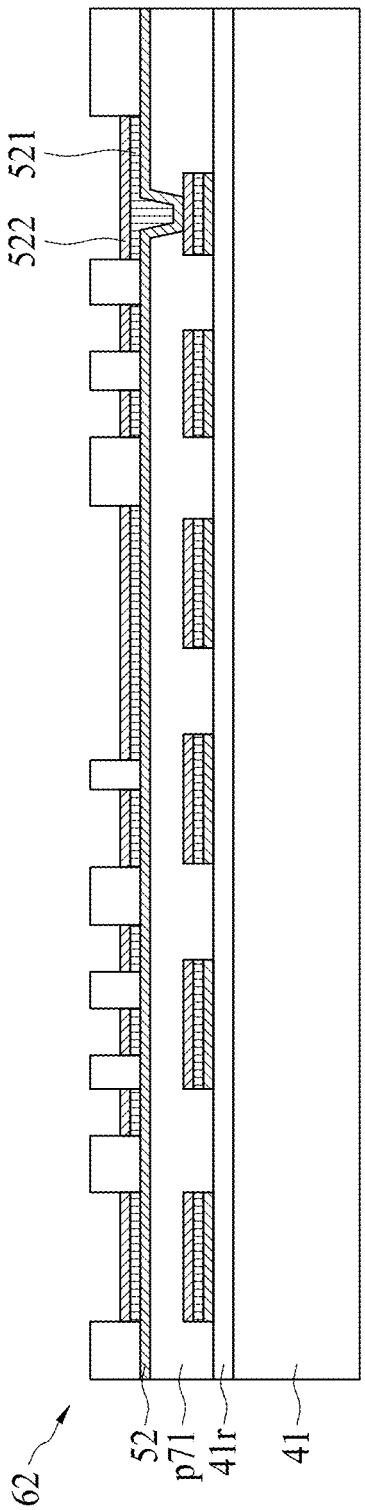

Referring to FIG. 11G, a second barrier layer 521 and a second soldering layer 522 are sequentially formed on the exposed portions of the second seed layer 52. The second barrier layer 521 fills the exposed portion of the second seed layer 52 disposed in the opening p71H. Suitable processes, materials and dimensions for forming the second barrier layer 521 and the second soldering layer 522 are similar to or identical with those for forming the first barrier layer 511 and the first soldering layer 512, respectively, as described and illustrated with reference to FIG. 11C. Afterwards, the pattered second photoresist layer 62 is removed, exposing portions of the second seed layer 52 unmasked by the second barrier layer 521 and the second soldering layer 522.

Figure 11H:
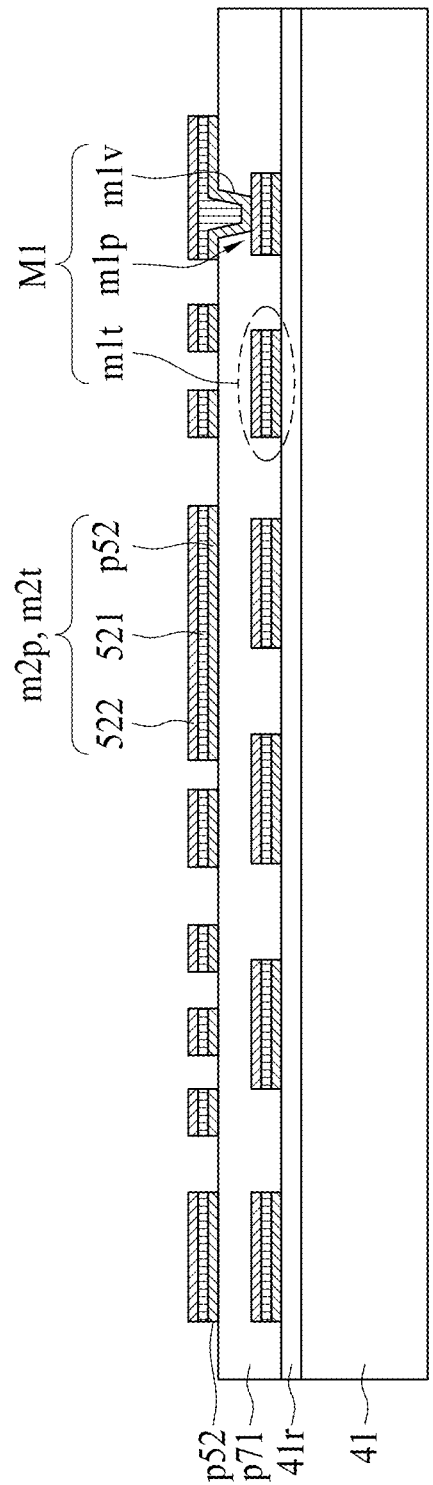

Next, referring to FIG. 11H, the exposed portions of the second seed layer 52 are patterned in an etching process, resulting in a patterned second seed layer p52. The patterned second seed layer p52, the second barrier layer 521 and the second soldering layer 522, formed in a stack, constitute second conductive pads m2p or second conductive traces m2t of a second conductive layer in the redistribution structure under building. The line width and spacing (L/S) for the second conductive pads m2p and the second conductive traces m2t are not greater than approximately 2 µm and 2 µm, respectively. In addition, the second barrier layer 521 filled in an opening p71H and the patterned second seed layer p52 associated with the opening p71H constitute a conductive via m1v of a first conductive layer M1 in the redistribution structure under building. Specifically, also referring to FIG. 11D, the first conductive layer M1 includes the first conductive pads m1p, the first conductive traces m1t and the first conductive vias m1v.

Figure 11I:
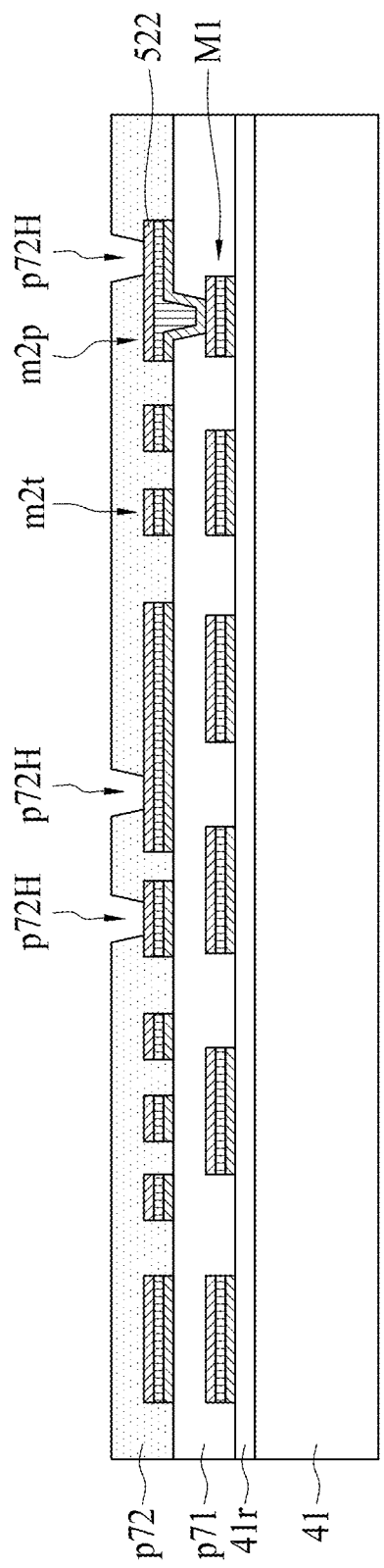

Subsequently, referring to FIG. 11I, a patterned second dielectric layer p72 is formed on the patterned first dielectric layer p71, exposing portions of the second conductive pads m2p or second conductive traces m2t through openings p72H. Suitable processes, materials and dimensions for forming the patterned second dielectric layer p72 are similar to or identical with those for forming the patterned first dielectric layer p71, as described and illustrated with reference to FIG. 11D.

Figure 11J:
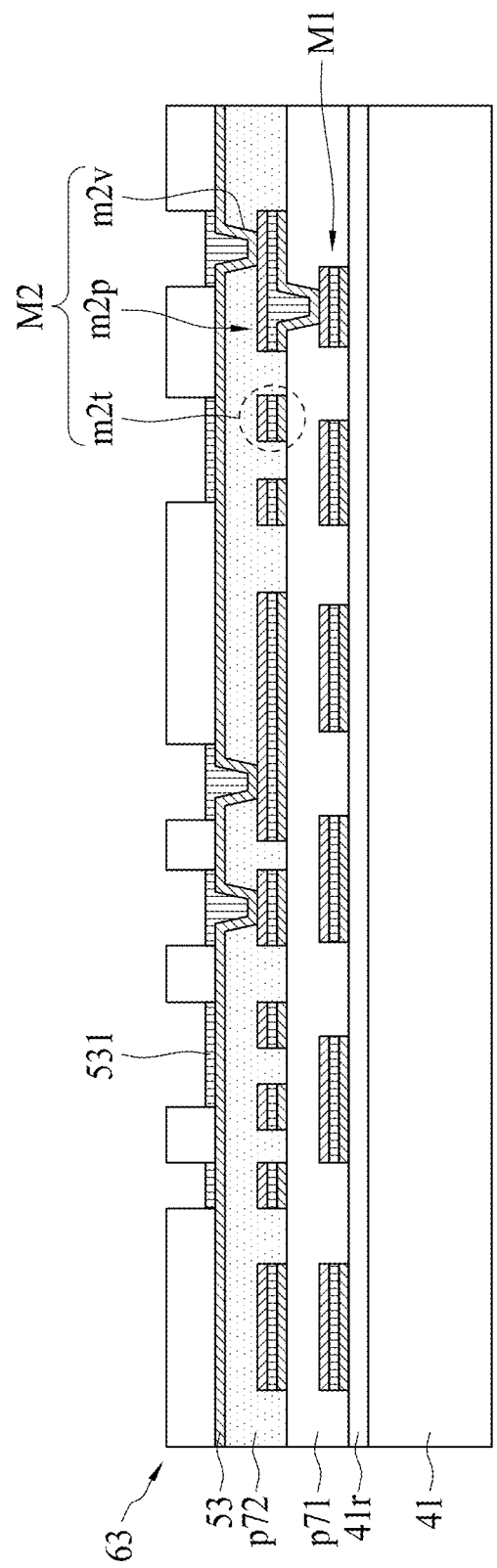

Referring to FIG. 11J, a third seed layer 53 is conformally formed on the patterned second dielectric layer p72. Suitable processes, materials and dimensions for forming the third seed layer 53 are similar to or identical with those for forming the first seed layer 51, as described and illustrated with reference to FIG. 11A. Afterwards, a patterned third photoresist layer 63 is formed on the third seed layer 53, exposing portions of the third seed layer 53. In particular, the patterned third photoresist layer 63 exposes the third seed layer 53 disposed in the opening p72H. Suitable processes for forming the patterned third photoresist layer 63 are similar to or identical with those for forming the patterned first photoresist layer 61, as described and illustrated with reference to FIG. 11B.

Subsequently, a third barrier layer 531 is formed on the exposed portions of the third seed layer 53. The third barrier layer 531 fills the exposed portion of the third seed layer 53 disposed in the opening p72H. Suitable processes, materials and dimensions for forming the third barrier layer 531 are similar to or identical with those for forming the first barrier layer 511, as described and illustrated with reference to FIG. 11C. Afterwards, the pattered third photoresist layer 63 is removed, exposing portions of the third seed layer 53 unmasked by the third barrier layer 531.

Figure 11K:
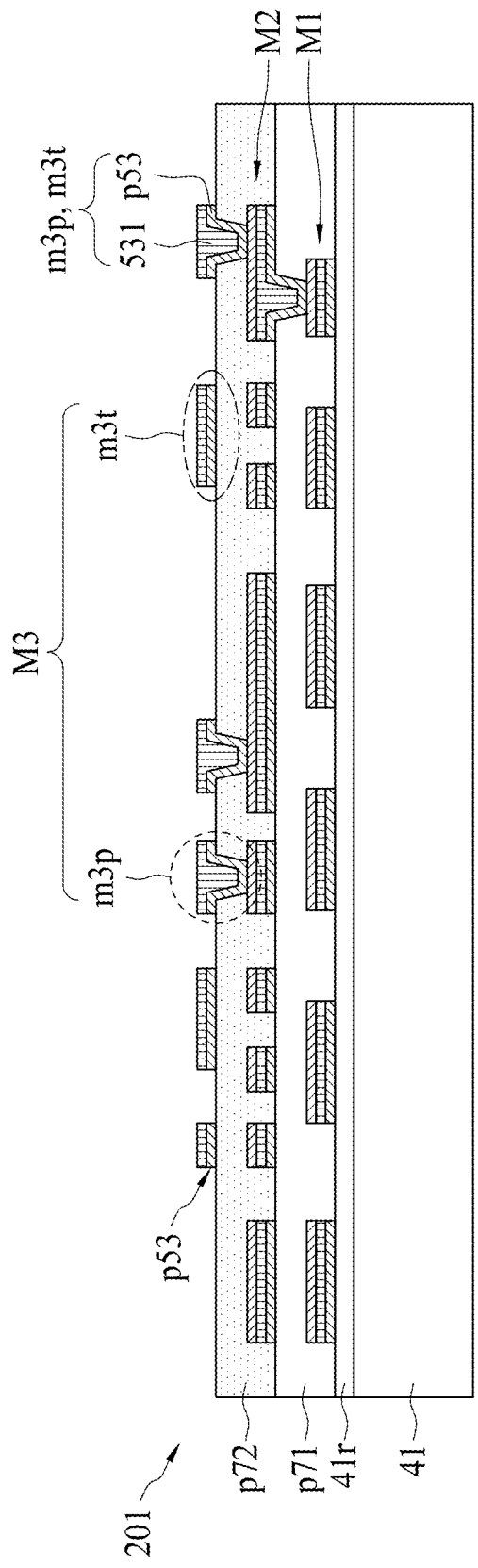

Further, referring to FIG. 11K, the exposed portions of the third seed layer 53 are patterned in an etching process, resulting in a patterned third seed layer p53. The patterned third seed layer p53 and the third barrier layer 531, formed in a stack, constitute third conductive pads m3p or third conductive traces m3t of a third conductive layer M3 in the redistribution structure under building. The line width and spacing (L/S) for the third conductive pads m3p and the third conductive traces m3t are not greater than approximately 2 µm and 2 µm, respectively. In addition, the third barrier layer 531 filled in an opening p72H and the patterned third seed layer p53 associated with the opening p72H constitute a conductive via m2v of a second conductive layer M2 in the redistribution structure under building. Specifically, also referring back to FIG. 11J, the second conductive layer M2 includes the second conductive pads m2p, the second conductive traces m2t and the second conductive vias m2v.

As a result, a redistribution structure 201 having a 2P3M configuration is achieved, including the patterned first and second dielectric layers p71, p72 as the 2P while the first, second and third conductive layers M1, M2, M3 as the 3M. The 2P3M redistribution structure 201 is just exemplary and not limiting. A redistribution structure having different configurations can be prepared in accordance with the method described and illustrated with reference to FIGS. 11A to 11K without departing from the contemplated scope of the present disclosure.

Figure 12A:
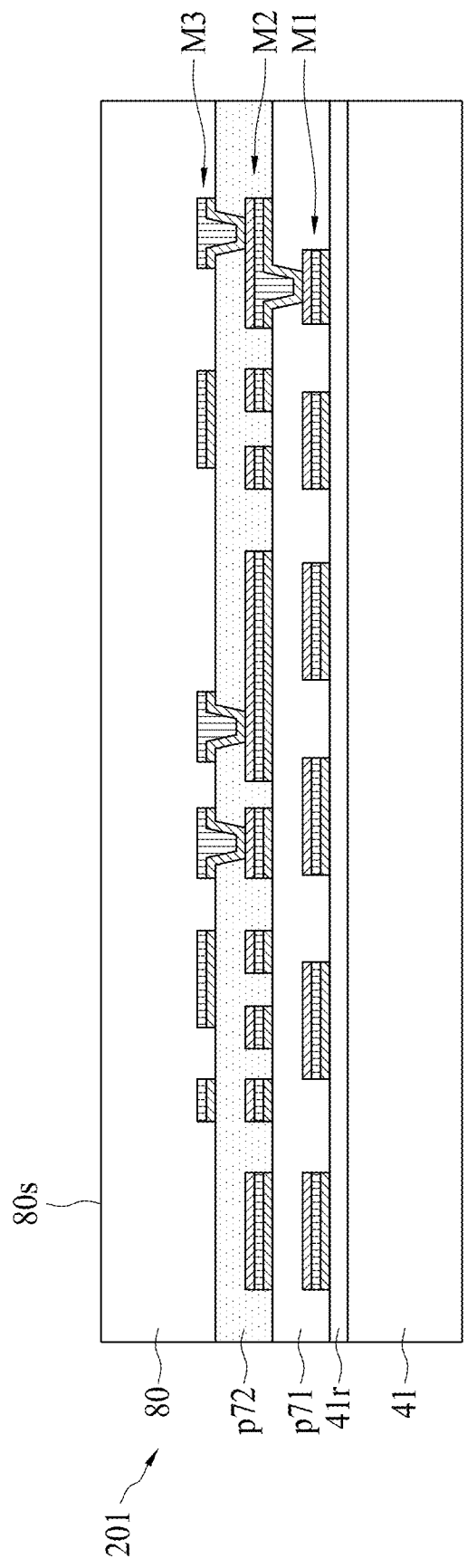
FIG. 12A, FIG. 12B, and FIG. 12C illustrate one or more stages of a method of manufacturing a substrate structure as illustrated in FIG. 1, in accordance with an embodiment of the present disclosure.
Figure 12B:
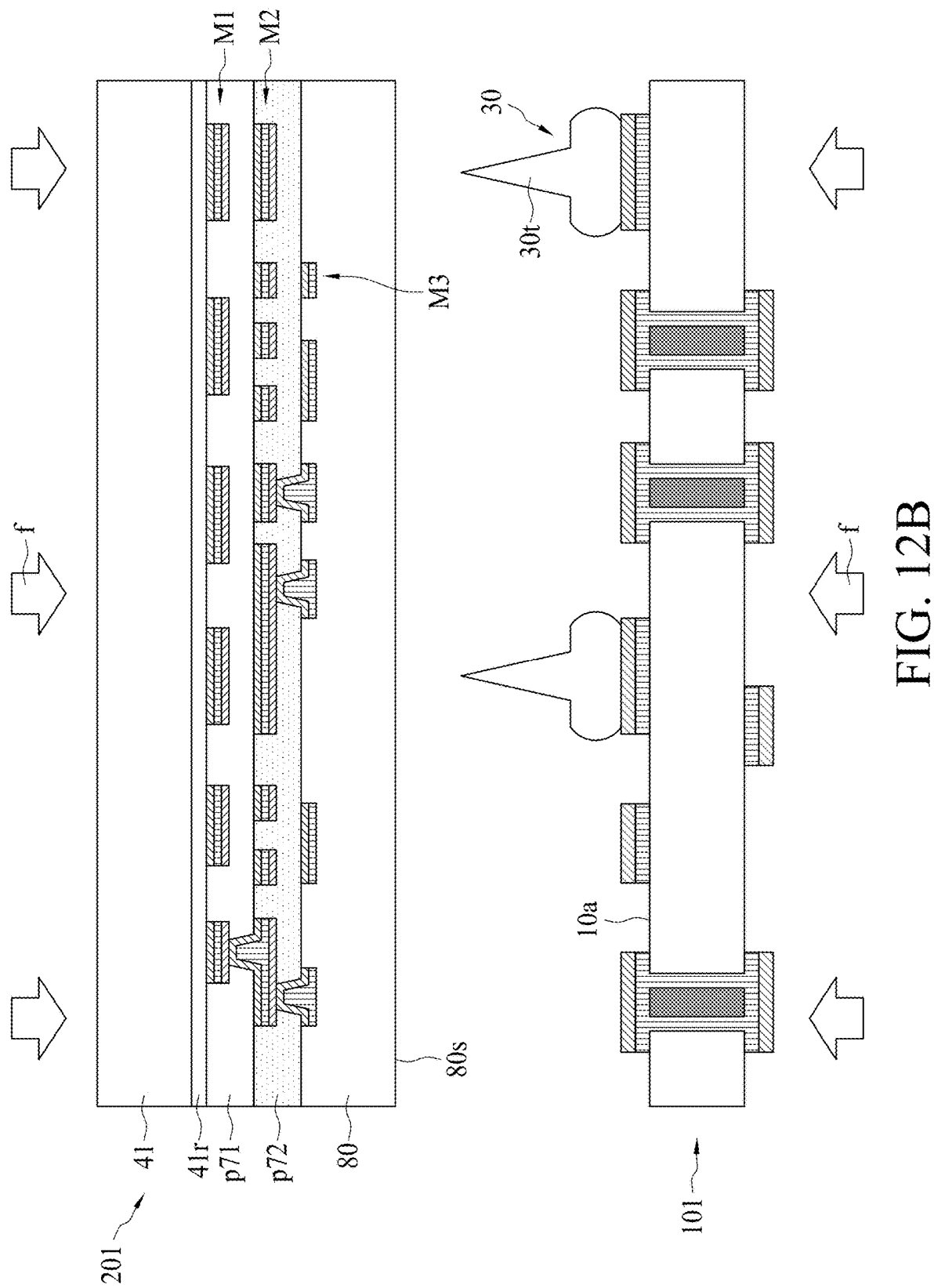
Figure 12C:
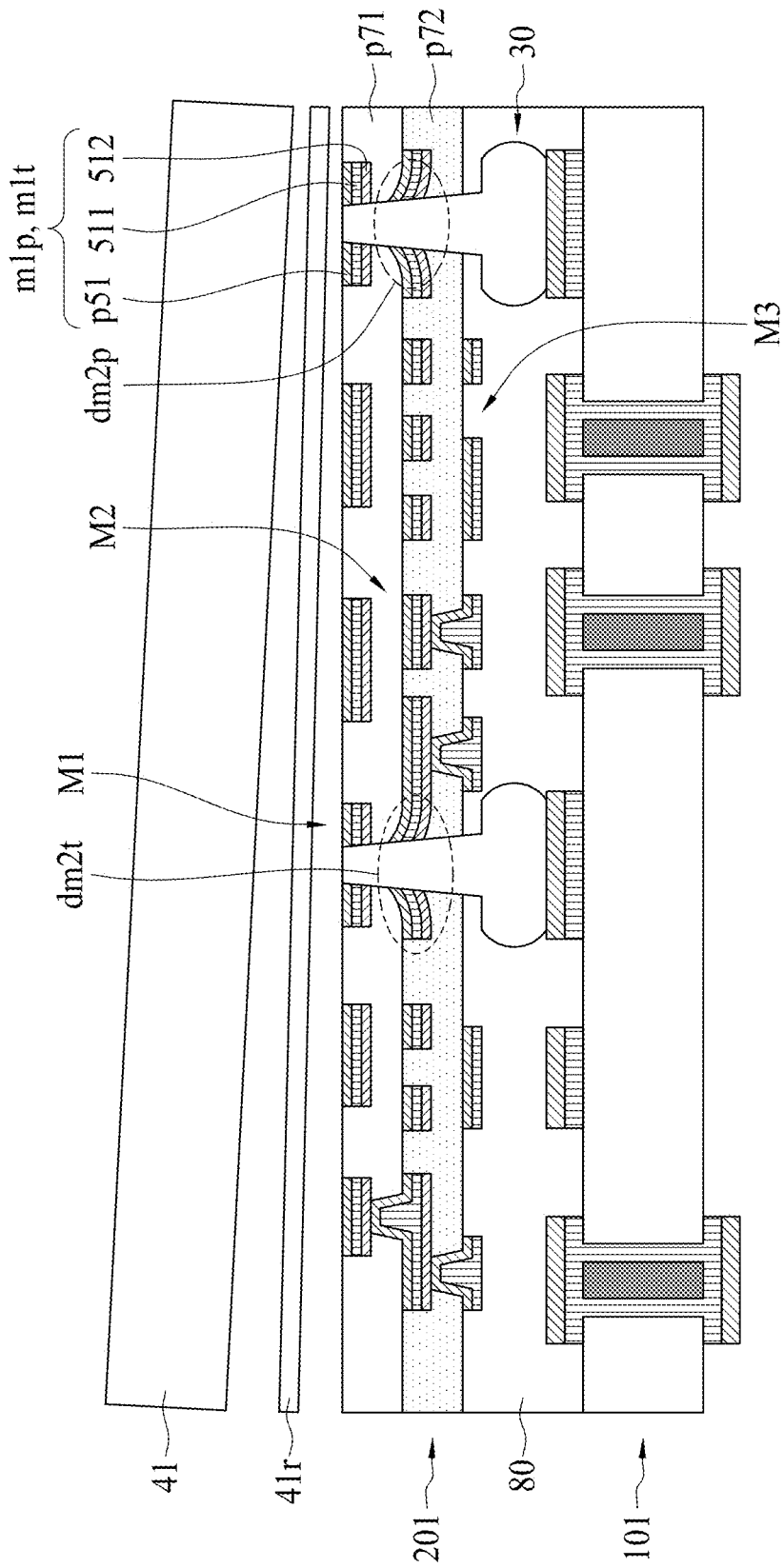

FIG. 12A through FIG. 12C illustrate one or more stages of a method of manufacturing a substrate structure as illustrated in FIG. 1, in accordance with an embodiment of the present disclosure.

Referring to FIG. 12A, an adhesive layer 80 is formed on the redistribution structure 201 by using, for example, a printing, lamination, potting or coating process, covering the third conductive layer M3 and the patterned second dielectric layer p72. The adhesive layer 80 facilitates attaching the redistribution structure 201 to the substrate 101, and serves as a buffer against a thrusting force from a connecting component. The adhesive layer 80 has a surface 80s facing away from the first carrier 41. Suitable materials for the adhesive layer 80 include ACP, ACF, nonconductive paste (NCP), nonconductive film (NCF), PI, epoxy or resin. In an embodiment, the adhesive layer 80 has a thickness ranging from approximately 20 µm to approximately 100 µm.

Referring to FIG. 12B, a substrate 101 with one or more connecting components 30 formed thereon is provided. In addition, a redistribution structure 201 attached with an adhesive layer 80 is provided. The tip portion 30t of the connecting component 30 is oriented towards the surface 80s of the adhesive layer 80. Force f is then applied, for example, from a laminator to combine the substrate 101 and the redistribution 201 (the arrows showing the movement). Consequently, the connecting component 30 thrusts through the adhesive layer 80 into the redistribution structure 201. In particular, referring to FIG. 12C, the connecting component 30 penetrates, in addition to the adhesive layer 80, the patterned second dielectric layer p72 and then the patterned first dielectric layer p71 to reach the first conductive layer M1 in the redistribution structure 201, thereby electrically connecting the substrate 101 and the redistribution structure 201. Moreover, the connecting component 30 may thrust its way through one or more conductive layers towards the first conductive layer M1. In the present example, connecting components 30 penetrate a second conductive trace m2t and a second conductive pad m2p, resulting in a deformed second conductive trace dm2t and a deformed second conductive pad dm2p, respectively. As such, a connecting component 30 may electrically connect the substrate 101 to a desired conductive layer in the redistribution structure 201.

The first release film 41r or the first carrier 41 or both serves as a buffer against the thrusting of the connecting component 30 for the first conductive layer M1, which is disposed most adjacent to the first release film 41r or the first carrier 41. As a result, in a first conductive pad m1p or a first conductive trace m1t of a first conductive layer M1 in electrical connection with a connecting component 30, the first soldering layer 512 and the first barrier layer 511 are pierced, while the patterned first seed layer p51 may not be pierced through. Consequently, no significant deformation may occur at the first conductive pad m1p or trace m1t. The first carrier 41 and the first release film 41r are subsequently removed, resulting in a substrate structure 100 as illustrated in FIG. 1.

Referring back to FIG. 12B, instead of the stud-bump type connecting component 30, a pillar type connecting component 83 described and illustrated with reference to FIG. 10I is employed. Accordingly, a substrate 101 with one or more connecting components 83 formed thereon is provided. In addition, a redistribution structure 201 attached with an adhesive layer 80 is provided. The tip portion 83t of the connecting component 83 is oriented towards the surface 80s of the adhesive layer 80. Subsequently, the substrate 101 and the redistribution structure 201 are electrically connected to each other in a similar fashion as described and illustrated with reference to FIGS. 12B and 12C.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
  a substrate including a first conductor on a first surface of the substrate;
  a first redistribution structure disposed over the substrate;

a first adhesive layer between the substrate and the first redistribution structure; and a first connecting component, electrically connected with the first conductor, penetrating through the first adhesive layer into the first redistribution structure and electrically connecting the substrate to the first redistribution structure, wherein the first redistribution structure includes a first dielectric layer and a first conductive layer in the first dielectric layer, the first conductive layer including a first conductor, wherein the first connecting component physically contacts the first conductor of the first conductive layer and electrically connects the substrate to the first conductive layer, wherein the first redistribution structure includes a second dielectric layer between the substrate and the first dielectric layer, and includes a second conductive layer in the second dielectric layer, the second conductive layer including a second conductor, wherein the first connecting component penetrates through the second conductor of the second conductive layer, wherein the second conductor of the second conductive layer includes a raised portion surrounding the first connecting component.

2. The substrate structure of claim 1, wherein the first connecting component includes a base portion disposed on the first conductor, and a tip portion extending from the base portion in a tapered manner towards the first redistribution structure.

3. The substrate structure of claim 1, wherein the raised portion extends into the first dielectric layer.

4. The substrate structure of claim 1, wherein the first conductor of the first conductive layer includes a first seed layer and a first barrier layer on the first seed layer.

5. The substrate structure of claim 4, wherein the first conductor of the first conductive layer includes a first soldering layer, and the first barrier layer is disposed between the first seed layer and the first soldering layer.

6. The substrate structure of claim 1 further comprising a second redistribution structure under a second surface of the substrate, the second surface opposite to the first surface, and comprising a second adhesive layer between the substrate and the second redistribution layer.

7. The substrate structure of claim 6, wherein the substrate includes a second conductor on the second surface, further comprising a second connecting component, electrically connected with the second conductor, penetrating through the second adhesive layer into the second redistribution structure and electrically connecting the substrate to the second redistribution structure.

8. The substrate structure of claim 1, wherein the first redistribution structure includes a first conductor covered in the first adhesive layer, further comprising a pillar connected between the first conductor of the first redistribution structure and the first conductor of the substrate.

9. The substrate structure of claim 8, wherein the first redistribution structure includes a second conductor covered in the first adhesive layer, further comprising a device electrically connected between the first conductor and the second conductor of the first redistribution structure.

10. A method of manufacturing a substrate structure, the method comprising:
providing a substrate plate having a first surface;
forming a first conductor on the first surface;
forming a first connecting component on the first conductor, the first connecting component including a tip portion, wherein the first connecting component includes a stud bump, and wherein forming the first connecting component on the first conductor includes:
  forming a stud bump on the first conductor by a wire bonding process;
providing a first redistribution structure; and
combining the substrate and the first redistribution structure by thrusting the first connecting component at the tip portion into the first redistribution structure.

11. The method of claim 10, wherein combining the substrate and the first redistribution structure includes:
attaching a first adhesive layer on the first redistribution structure; and
electrically connecting the substrate and the first redistribution structure in a lamination process, causing the first connecting component to penetrate through the first adhesive layer into the first redistribution structure.

12. The method of claim 10, wherein the first redistribution structure includes a first conductive layer, the first conductive layer including a first conductor, wherein combining the substrate and the first redistribution structure includes thrusting the first connecting component into the first conductor of the first conductive layer.

13. The method of claim 12, wherein the first redistribution structure includes a second conductive layer between the first conductive layer and the substrate, the second conductive layer including a second conductor, wherein combining the substrate and the first redistribution structure includes thrusting the first connecting component into the second conductor of the second conductive layer.

14. The method of claim 10, wherein after forming a first conductor on the first surface further includes:
forming a second conductor on the first surface;
forming a second connecting component on the second conductor; and
in combining the substrate and the first redistribution structure, thrusting the second connecting component into a different conductive layer in the first redistribution structure than the first connecting component.

15. The method of claim 11 further comprising:
forming a second conductor on a second surface of the substrate, the second surface opposite to the first surface;
forming a second connecting component on the second conductor, the second connecting component including a tip portion;
providing a second redistribution structure; and
combining the substrate and the second redistribution structure by thrusting the second connecting component at the tip portion into the second redistribution structure.

* * * * *